US012749308B2

(12) United States Patent
Srinivasan et al.

(10) Patent No.: US 12,749,308 B2
(45) Date of Patent: Sep. 29, 2026

(54) CAMERA APPARATUS AND METHOD FOR REDUCING LATENCY IN PLANT DETECTION FROM TIME OF IMAGE CAPTURE

(71) Applicant: Tartan Aerial Sense Tech Private Limited, Bangalore (IN)

(72) Inventors: Gunasekaran Srinivasan, Thiruvalam (IN); Dhivakar Kanagaraj, Karur (IN); Pranav M P, Bengaluru (IN); Raghul Raghu, Madurai (IN); Prakash Mathews Pothen, Thiruvalla (IN); S Prajwal, Karnataka (IN)

(73) Assignee: Tartan Aerial Sense Tech Private Limited, Bangalore (IN)

( * ) Notice: Subject to any disclaimer, the term of this patent is extended or adjusted under 35 U.S.C. 154(b) by 274 days.

(21) Appl. No.: 18/791,324

(22) Filed: Jul. 31, 2024

(65) Prior Publication Data

US 2025/0131715 A1 Apr. 24, 2025

Related U.S. Application Data

(63) Continuation of application No. 18/586,401, filed on Feb. 23, 2024, now Pat. No. 12,080,064.

(30) Foreign Application Priority Data

Oct. 19, 2023 (IN) ............................ 202341071593

(51) Int. Cl.
*G06V 20/10* (2022.01)
*G06T 3/4015* (2024.01)
(Continued)

(52) U.S. Cl.
CPC .......... *G06V 20/188* (2022.01); *G06T 3/4015* (2013.01); *G06T 5/40* (2013.01);
(Continued)

(58) Field of Classification Search
CPC .. G06V 20/188; G06V 10/25; G06V 10/7747; G06V 10/56; G06V 10/7715;
(Continued)

(56) References Cited

U.S. PATENT DOCUMENTS

| | | | | |
|---|---|---|---|---|
| 11,288,535 | B1 * | 3/2022 | He | G06F 18/21 |
| 12,080,064 | B1 * | 9/2024 | Srinivasan | G06V 20/188 |

(Continued)

*Primary Examiner* — Michael R Neff
(74) *Attorney, Agent, or Firm* — Barta Jones. PLLC

(57) ABSTRACT

A camera apparatus including a central processing unit configured to capture raw image sensor data of a field-of-view of an agricultural field, concurrently execute a plurality of different image transformation operations in a single pass on the captured raw image sensor data to obtain a processed image output, based on an one-time read of pixel values of the captured raw image sensor data and push the processed image output in a shared memory accessible to a plurality of application nodes in the camera apparatus. The camera apparatus includes a graphical processing unit configured to cause the plurality of application nodes to concurrently access the processed image output from the shared memory to detect one or more foliage regions or one or more crop plants in the processed image output.

20 Claims, 16 Drawing Sheets

(51) Int. Cl.

| | |
|---|---|
| ***G06T 5/40*** | (2006.01) |
| ***G06T 5/60*** | (2024.01) |
| ***G06T 5/70*** | (2024.01) |
| ***G06T 7/11*** | (2017.01) |
| ***G06T 7/136*** | (2017.01) |
| ***G06T 7/155*** | (2017.01) |
| ***G06T 7/194*** | (2017.01) |
| ***G06T 7/90*** | (2017.01) |
| ***G06T 11/60*** | (2006.01) |
| ***G06V 10/25*** | (2022.01) |
| ***G06V 10/26*** | (2022.01) |
| ***G06V 10/30*** | (2022.01) |
| ***G06V 10/56*** | (2022.01) |
| ***G06V 10/764*** | (2022.01) |
| ***G06V 10/77*** | (2022.01) |
| ***G06V 10/774*** | (2022.01) |
| ***G06V 10/776*** | (2022.01) |
| ***G06V 10/82*** | (2022.01) |
| ***H04N 1/60*** | (2006.01) |
| ***H04N 9/73*** | (2023.01) |
| ***H05K 1/181*** | (2026.01) |
| *H04N 23/84* | (2023.01) |

(52) U.S. Cl.

CPC .................. *G06T 5/60* (2024.01); *G06T 5/70* (2024.01); *G06T 7/11* (2017.01); *G06T 7/136* (2017.01); *G06T 7/155* (2017.01); *G06T 7/194* (2017.01); *G06T 7/90* (2017.01); *G06T 11/60* (2013.01); *G06V 10/25* (2022.01); *G06V 10/26* (2022.01); *G06V 10/273* (2022.01); *G06V 10/30* (2022.01); *G06V 10/56* (2022.01); *G06V 10/764* (2022.01); *G06V 10/7715* (2022.01); *G06V 10/774* (2022.01); *G06V 10/7747* (2022.01); *G06V 10/776* (2022.01); *G06V 10/82* (2022.01); *H04N 1/6002* (2013.01); *H04N 9/73* (2013.01); *H05K 1/181* (2013.01); *G06T 2207/10024* (2013.01); *G06T 2207/20032* (2013.01); *G06T 2207/20036* (2013.01); *G06T 2207/20081* (2013.01); *G06T 2207/20084* (2013.01); *G06T 2207/30188* (2013.01); *G06V 2201/07* (2022.01); *H04N 23/84* (2023.01); *H05K 2201/10121* (2013.01); *H05K 2201/10151* (2013.01); *H05K 2201/10159* (2013.01)

(58) Field of Classification Search

CPC ...... G06V 10/82; G06V 10/30; G06V 10/273; G06V 10/26; G06V 10/774; G06V 10/776; G06V 10/764; G06T 7/136; G06T 7/194; G06T 7/11; G06T 7/90; G06T 7/155; G06T 5/60; G06T 5/70; G06T 3/4015; G06T 5/40; G06T 11/60; H04N 1/6002; H04N 9/73; H05K 1/181

USPC .......................................................... 382/103

See application file for complete search history.

(56) References Cited

U.S. PATENT DOCUMENTS

| | | | | |
|---|---|---|---|---|
| 2016/0155024 | A1* | 6/2016 | Partis | G06V 20/35<br>382/173 |
| 2017/0032214 | A1* | 2/2017 | Krenzer | G06F 17/145 |
| 2022/0122347 | A1* | 4/2022 | Bhatt | G06V 10/95 |
| 2024/0069551 | A1* | 2/2024 | Infantini | A01D 41/127 |
| 2024/0212342 | A1* | 6/2024 | Srinivasan | G06V 20/188 |

* cited by examiner

CAMERA APPARATUS AND METHOD FOR REDUCING LATENCY IN PLANT DETECTION FROM TIME OF IMAGE CAPTURE

CROSS-REFERENCE TO RELATED APPLICATIONS/INCORPORATION BY REFERENCE

This Patent Application makes reference to, claims priority to, claims the benefit of, and is a Continuation Application of U.S. patent application Ser. No. 18/586,401, filed on Feb. 23, 2024, which claims priority to an Indian Provisional Patent Application No. 202341071593, filed on Oct. 19, 2023.

The above referenced applications are hereby incorporated herein by reference in their entirety.

FIELD OF TECHNOLOGY

Certain embodiments of the disclosure relate to agricultural machines and camera systems with agricultural applications. More specifically, certain embodiments of the disclosure relate to a camera apparatus and a method for reducing latency in plant detection (e.g., crop detection or foliage detection) from time of capture of images of an agricultural field.

BACKGROUND

With the rapid advancement of machines, agricultural implements, special-purpose vehicles, and vehicle mounted apparatus, productivity in agricultural operations has increased. However, existing vehicle-based agricultural systems are very complex in nature, where a particular system or machinery works only when it is from a same manufacturer. In other words, one system of one manufacturer is not compatible with another system of another manufacturer. This binds a farmer to use costly machineries and agricultural implements of one specific manufacturer as crosstalk among different electronics and mechatronics systems is generally restricted or severely limited in use.

Furthermore, modern agronomy makes the use of the best technological devices and techniques for the increase in the yield. Plant detection plays a crucial role in camera-driven agricultural solutions due to its significant impact on farm upkeep and automation. The plant detection includes foliage detection, crop detection as well as weed detection. For example, the plant detection finds application in targeted weed control, real-time crop monitoring, monitoring irrigation needs, identifying patterns and trends in crop growth, selective harvesting, automatic camera-driven operation of various agricultural tools or implements (e.g., sprayers, cutters, harvesters etc.) attached to agricultural machines, and/or in other camera-driven agricultural solutions. However, in the realm of camera technology for plant detection in agricultural fields, several technical problems persist, hindering the accuracy and efficacy of these systems. In a first example, unlike controlled settings, agricultural fields are often uneven, with varying terrain, obstacles, and clutter. This complexity makes it challenging for cameras to identify specific patterns or features of plants. In a second example, conventional cameras are often calibrated for standard environments, making them less effective in the unique conditions of agricultural fields. This can lead to issues with color accuracy, perspective distortion, and image clarity. Examples of the unique conditions of agricultural fields include but are not limited to, a) the sunlight variation issue, i.e., sunlight constantly changes throughout the day, causing shadows, reflections, and variations in brightness; b) using only green color pixels in conventional camera systems and methods for plant detection are found to be misleading leading to misidentification by cameras. This can make it difficult for cameras to accurately distinguish between plants and other objects.

In another example, use of a conventional high-resolution camera system to capture images of one or more agricultural fields having different terrain, leads to a gigantic increase in cost due to high processing power which, is required for processing a huge number of pixels of an image. Also, for the high processing power, more advanced hardware components are required which, results in an extensive cost of the conventional camera system. Moreover, the conventional camera system faces a technical issue of an increased latency in plant detection that is the latency from a timepoint when images are captured to a timepoint when an application receives the images for further processing gets increased, which is not desirable.

In a yet another example, when an agricultural vehicle is in motion, the plant detection latency becomes more crucial. When the agricultural vehicle is in motion, the plant detection should be performed very fast and the agricultural vehicle is required not to miss out any plant for detection. Although, because of the increased plant detection latency due to high processing power of the conventional camera system, it is highly likely that the agricultural vehicle may miss a plant for detection consequently, the agricultural vehicle can't be actuated for a required actuation function at a right time and at a right place, which is also not desirable.

Currently, certain attempts have been made to reduce the latency in a camera system, from time of capture of an image to a timepoint when an application receives the image for further processing. When the image is captured, a lot of post-processing operations are performed on the captured image, for example, white balance, color correction, contrast stretching, and the like, in order to generate a modified image in a specific input format. The post-processing operations are performed sequentially on the captured image, resulting to an increased latency of plant detection. Moreover, conventional Artificial Intelligence (AI) model operates only on the images having specific input formats to generate a processed image output, which also results in an increase in plant detection latency. Thus, all aforementioned factors contribute to a significant increase in the latency of plant detection, which is not preferrable for many real-time application scenarios.

Further limitations and disadvantages of conventional and traditional approaches will become apparent to one of skill in the art through comparison of such systems with some aspects of the present disclosure as set forth in the remainder of the present application with reference to the drawings.

BRIEF SUMMARY OF THE DISCLOSURE

A camera apparatus and a method for reducing latency in plant detection from time of image capture, substantially as shown in and/or described in connection with at least one of the figures, as set forth more completely in the claims. The disclosed camera apparatus and method significantly improves the latency from time of capturing an image to a time a drop detection or foliage detection occurs in the image.

These and other advantages, aspects and novel features of the present disclosure, as well as details of an illustrated embodiment thereof, will be more fully understood from the following description and drawings.

BRIEF DESCRIPTION OF DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

DETAILED DESCRIPTION OF THE DISCLOSURE

Figure 1A:
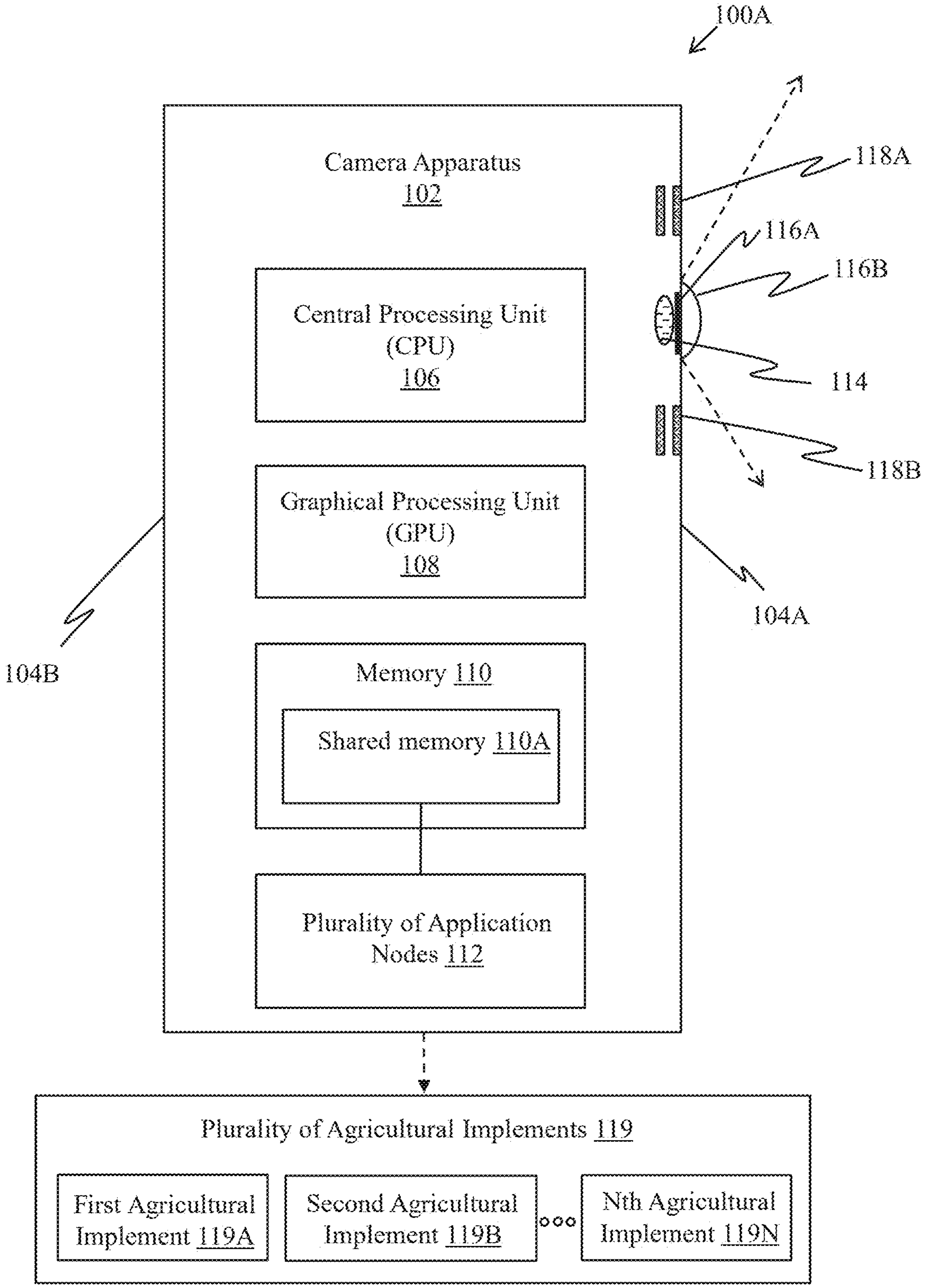
FIG. 1A is a diagram illustrating various exemplary components of a camera apparatus, in accordance with an embodiment of the present disclosure.

Certain embodiments of the disclosure may be found in a camera apparatus, and a method for reducing latency in plant detection from a time of image capture. The disclosed camera apparatus and method provides significant improvement over conventional systems that perform crop detection or foliage detection using a camera. Typically, many image post processing operations (e.g., mosaicking, white balance, color correction etc.) are done when an image is captured and then passed to a number of applications or a number of neural network models for any detection like foliage or crop plant detection. Further, depending on a number of applications or a number of neural network models that require the image after all the post processing, the latency is further increased due to numerous copy operation for each of the applications or neural network models. Thirdly, conventional neural network models also have a requirement of specific input format (e.g., image of a particular size or format), which again requires processing of image(s) before the conventional neural network models are able to receive them as input for processing. These three points along with the need to process high-resolution images (greater than 10 MB) in most conventional systems, are observed to contribute significantly in increasing the latency in conventional systems. In contrast to the conventional camera systems, the disclosed camera apparatus and method manifest a significant reduction of latency in plant detection (i.e., a three-stage latency reduction). Advantageously, the disclosed camera apparatus and method employs a concurrent execution of different image transformation operations in a single pass and generate a processed output, which is pushed to a shared memory. By virtue of using the shared memory, each application node can simultaneously access the processed output and perform detection of one or more foliage regions or one or more crop plants, concurrently. The concurrent execution of different image transformation operations in a single pass and the use of the shared memory significantly reduces the latency in plant detection and enables the disclosed camera apparatus to be useful for real time or near real time application scenarios. Further, beneficially, some image processing operations previously done in conventional systems to fit the input format requirement of the neural network models are shifted to one or more layers of neural network itself for processing in the present disclosure, which further reduces the latency in plant detection from a time of image capture. Moreover, the disclosed camera apparatus can be used in a moving agricultural vehicle and does not miss the detection of any crop plant or foliage while in motion because of having the reduced latency and can actuate a suitable actuation function (e.g., actuating a sprayer or a cutter) at a right time and a right place of the agricultural field.

In the following description, reference is made to the accompanying drawings, which form a part hereof, and in which is shown, by way of illustration, various embodiments of the present disclosure.

FIG. 1A is a diagram illustrating various exemplary components of a camera apparatus, in accordance with an embodiment of the present disclosure. With reference to FIG. 1A, there is shown a diagram 100A of a camera apparatus 102. The camera apparatus 102 may have a front side 104A and a rear side 104B. The camera apparatus 102 may include a Central Processing Unit (CPU) 106, a Graphical Processing Unit (GPU) 108, a memory 110 and a plurality of application nodes 112. The memory 110 may include a shared memory 110A which is accessible to the CPU 106 and the GPU 108. Each of the CPU 106, the GPU 108, the memory 110 including the shared memory 110A and the plurality of application nodes 112 are communicatively coupled to each other. Furthermore, the front side

104A of the camera apparatus 102 may include an image sensor 114, a lens 116A, a lens protector 116B, and a plurality of light diffusers, such as a first light diffuser 118A and a second light diffuser 118B. Furthermore, any of the CPU 106 or the GPU 108 is further configured to operate at least one of a plurality of agricultural implements 119, such as a first agricultural implement 119A based on detected one or more foliage regions. The plurality of agricultural implements 119 may include N agricultural implements, such as the first agricultural implement 119A, a second agricultural implement 119B, up to a Nth agricultural implement 119N.

In an implementation, the camera apparatus 102 may be removably mounted in a vehicle, such as a tractor or any other agricultural vehicle. The camera apparatus 102 is configured to capture an input color image (e.g., a color image that captures a portion (e.g., 1.75-2.25 meters or approximately 2 meters) of an agricultural field comprising soil and foliage (e.g., plants that may include weeds and crop plants, hereinafter simply referred to as a foliage image). In an implementation, the camera apparatus 102 is configured to capture a wide field-of-view (FOV), for example, 1.75 to 2.25 meters of a physical agricultural field as compared to smaller FOV in conventional systems (typically less than 1.5 meters). The lens 116A improves the FOV of the image sensor 114. In an implementation, the FOV corresponds to approximately 2 meters of the agricultural field. The FOV of the camera apparatus 102 is represented by dotted lines in FIG. 1A. In an implementation, the camera apparatus 102 may be oriented at a specific angle (e.g., 45 degree or 60°) in order to capture a few metres in forward as well as in downward direction, for example, up to 80-90 cm downwards or up to 1.7 to 2.25 metres ahead.

The CPU 106 may include suitable logic, circuitry, interfaces and/or code that is configured to capture raw image sensor data of a FOV of an agricultural field using the image sensor 114. Examples of the CPU 106 may include, but are not limited to a system-on-module (SoM) processor, an integrated circuit, a co-processor, a microprocessor, a microcontroller, a complex instruction set computing (CISC) processor, an application-specific integrated circuit (ASIC) processor, a reduced instruction set (RISC) processor, a very long instruction word (VLIW) processor, a state machine, a data processing unit, and other processors or circuits. Moreover, the CPU 106 may refer to one or more individual processors, processing devices, a processing unit that is part of a machine.

The GPU 108 may include suitable logic, circuitry, interfaces and/or code that is configured to process images and videos for display. The GPU 108 may be considered as a parallel processor with numerous cores that can handle multiple tasks simultaneously. Examples of implementation of the GPU 108 may include but are not limited to a system-on-module (SOM) processor, an integrated circuit, a co-processor, a a microcontroller, a complex instruction set computing (CISC) processor, an application-specific integrated circuit (ASIC) processor, a reduced instruction set (RISC) processor, a very long instruction word (VLIW) processor, a state machine, a data processing unit, and other processors or circuits. Moreover, the GPU 108 may refer to one or more individual processors, processing devices, a processing unit that is part of a machine.

The memory 110 may include suitable logic, circuitry, interfaces and/or code that is configured to store machine code and/or instructions executable by either the CPU 106 or the GPU 108. Examples of implementation of the memory 110 may include, but are not limited to, a Solid-State Drive (SSD), Random Access Memory (RAM), Read Only Memory (ROM), Hard Disk Drive (HDD), Flash memory, a Secure Digital (SD) card, a computer readable storage medium, and/or CPU cache memory. The memory 110 may store an operating system and/or a computer program product to operate the camera apparatus 102. A computer readable storage medium for providing a non-transient memory may include, but is not limited to, an electronic storage device, a magnetic storage device, an optical storage device, an electromagnetic storage device, a semiconductor storage device, or any suitable combination of the foregoing. The memory 110 may include the shared memory 110A which is defined on a system-on-module (SOM) chip. Alternatively stated, the CPU 106, the GPU 108, the shared memory 110A are integrated in a single integrated circuit (IC) or chip or SOM IC. In an implementation, the shared memory 110A may be a memory block of the memory 110 and reserved for the operations performed by the CPU 106 and the GPU 108. The location of the shared memory 110A may have a memory address that is accessible to the CPU 106 and the GPU 108.

The plurality of application nodes 112 refers to memory areas or nodes where different applications are hosted. For example, one application node may indicate hosting location of a neural network model or application used for detecting one or more foliage regions present in a processed image output and another application node may indicate hosting location of another neural network model or application used for detecting one or more crop plants present in the processed image output.

In accordance with an embodiment, the front side 104A of the camera apparatus 102 may further comprise the lens 116A and the lens protector 116B that covers the lens 116A and the image sensor 114 of the camera apparatus 102. Alternatively stated, the lens 116A is positioned between the image sensor 114 and the lens protector 116B. The lens protector 116B may be configured as a filter screen to prevent dust particles and ultra-violet (UV) light from entering the image sensor 114 of the camera apparatus 102. The lens protector 116B may also be referred to as a lens protection filter that further protects from fogging. In an implementation, the lens protector 116B may be an anti-fogging glass that also protects the lens 116A and the image sensor 114 from dust, spray mist, and UV light.

In accordance with an embodiment, each of the first light diffuser 118A and the second light diffuser 118B may be configured to diffuse light emitted from a plurality of light sources, when the camera apparatus 102 is in operation to capture the raw image sensor data. The plurality of light sources may include, but not limited to, light emitting devices (LED), strobe-lights integrated in a light control printed circuit board (PCB). The light control PCB further comprises capacitors to power the LED or strobe-lights (not shown for brevity). In an implementation, the rear side 104B of the camera apparatus 102 may comprise a passive heat sink (not shown) to dissipate heat generated by the CPU 106 (e.g., the SOM processor) and the GPU 108 of the camera apparatus 102.

Figure 1B:
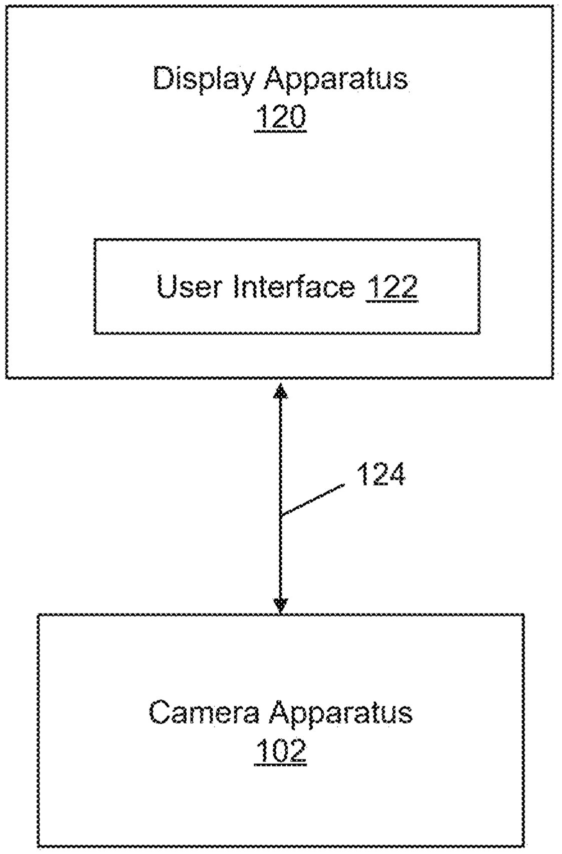
FIG. 1B is a diagram illustrating connection of a camera apparatus with a display apparatus, in accordance with an embodiment of the present disclosure.

FIG. 1B is a diagram illustrating connection of a camera apparatus with a display apparatus, in accordance with an embodiment of the present disclosure. FIG. 1B is described in conjunction with elements from FIG. 1A. With reference to FIG. 1B, there is shown that the camera apparatus 102 (of FIG. 1A) is connected to a display apparatus 120. The display apparatus 120 may comprise a User Interface (UI) 122. The connection between the camera apparatus 102 and the display apparatus 120 may be a Local Area Network (LAN) 124 connection or an ethernet connection. The UI 122 may be rendered on the display apparatus 120 and may be used to provide user input, for example, to interact with the camera apparatus 102. For example, the UI 122 may be used to select a spray mode, such as spot spray on crop plants, spray on entire foliage, or actuation of an agricultural implement (e.g., for lettuce thinning operation), and the like.

Figure 2A:
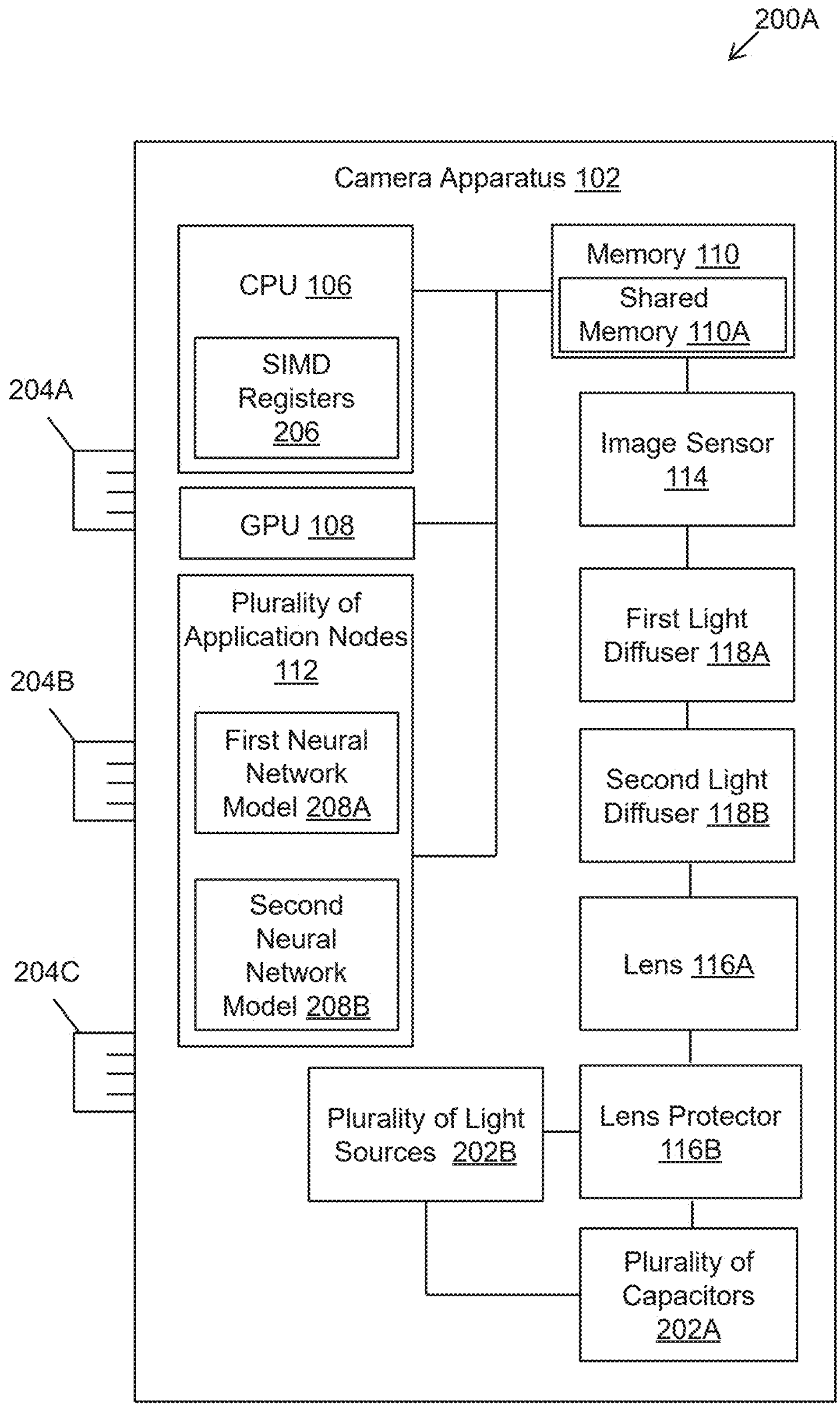
FIG. 2A is a block diagram illustrating various exemplary components of a camera apparatus, in accordance with another embodiment of the present disclosure.

FIG. 2A is a block diagram illustrating various exemplary components of a camera apparatus, in accordance with another embodiment of the present disclosure. FIG. 2A is described in conjunction with elements from FIGS. 1A and 1B. With reference to FIG. 2A, there is shown a block diagram 200A of the camera apparatus 102 (of FIG. 1A). The camera apparatus 102 may further include a plurality of capacitors 202A, a plurality of light sources 202B, and a plurality of connectors, such as a first connector 204A, a second connector 204B and a third connector 204C in addition to the components shown and described, for example, in the FIG. 1A. Furthermore, the CPU 106 may include Single Instruction, Multiple Data (SIMD) registers 206. The plurality of application nodes 112 may include a first Neural Network (NN) model 208A and a second NN model 208B. In another implementation, the plurality of application nodes 112 may have N neural network models or other applications (not shown here for sake of brevity).

Each of the plurality of capacitors 202A may be used to supply consistent power to the plurality of light sources 202B (such as LED or strobe lights) to generate high intensity light flashes for very short duration in sync with operation of the image sensor 114 of the camera apparatus 102 to capture raw image sensor data of an agricultural field.

In an implementation, the first connector 204A may be used as a power supply port to power the camera apparatus 102. The second connector 204B is configured to connect to one or more of the plurality of agricultural implements 119, such as a chemical sprayer or a mechanical implement to actuate cutting blades, to actuate the one or more of the plurality of the agricultural implements 119, devices, or tools. In an implementation, the second connector 204B may include multiple pins that can handle multiple actuation units, concurrently. For example, the camera apparatus 102 may include an integrated PCB that includes a plurality of actuators (e.g., 6-20 actuator chips) that may handle a plurality of electronically controllable spray valves in a sprayer. The third connector 204C is configured to establish a network with other camera apparatuses or other devices (e.g., the display apparatus 120) mounted in an agricultural vehicle or machine. In an example, the network may be a local area network (LAN) connection.

Each of the first NN model 208A and the second NN model 208B may be a deep neural network (DNN) model, such as a convolution neural network (CNN) model, which can be customized and re-configured either as a two-branch architecture or a three-branch architecture depending on an application scenario, where each branch may have a number of convolution layers to perform various operations. For example, the second NN model 208B has a first set of layers and a second set of layers to perform different kind of operations.

In operation, the camera apparatus 102 comprising the CPU 106 is configured to capture raw image sensor data of a FOV of an agricultural field using the image sensor 114. The raw image sensor data refers to the initial data captured directly from the image sensor 114 before it undergoes any processing. Generally, image sensors, such as the image sensor 114 includes an array of light-sensitive pixels used to capture light and convert it into an electrical signal. To capture color, image sensors are overlaid with a Color Filter Array (CFA), most commonly the Bayer filter, which consists of a repeating pattern of red, green, and blue filters. Demosaicing is one of the post-processing process of reconstructing a full-color image from the incomplete color samples i.e., the raw image sensor data obtained from the image sensor 114. A wide FOV, such as the FOV of approximately 2 meters, may be used to capture the raw image sensor data of the agricultural field. Examples of the agricultural field of crop plants may include, but is not limited to chili, brinjal, lettuce, potato, tomato, cabbage, cauliflower, carrot, radish, cotton agricultural field. Such agricultural field may also include different varieties of weeds along with the crop plants.

The CPU 106 is further configured to concurrently execute a plurality of different image transformation operations in a single pass on the captured raw image sensor data to obtain a processed image output, based on an one-time read of pixel values of the captured raw image sensor data. After capturing the raw image sensor data, the CPU 106 is further configured to simultaneously execute the plurality of different image transformation operations, such as white balance, color correction, contrast stretching, and the like, on the captured raw image sensor data. The plurality of different image transformation operations are executed in the single pass, which means all the image transformation operations are executed in a single loop by reading the pixels only once.

Typically, in conventional systems, there is a sequential execution of different image transformation operations, where output of one image transformation operation is provided as an input to another image transformation operation whose output is further used as an input to yet another image transformation operation. Consequently, latency in plant detection increases significantly in conventional camera systems due to the sequential execution of different image transformation operations.

In comparison to conventional systems, in the present disclosure, the plurality of different image transformation operations are executed not only concurrently but pixels are read only once for different image transformation operations followed by concurrent processing of different image transformation operations in a single pass (i.e., one loop) resulting in a significant reduction in latency in a first stage of captured image post-processing. The concurrent execution of the plurality of different image transformation operations is performed on the basis of the one-time read of pixel values of the captured raw image sensor data which, means the pixel values of the captured raw image sensor data is read one time instead of multiple times reading of same pixel values which is done conventionally. The reading of pixel values of the captured raw image sensor data is performed only once and the read pixel values are concurrently provided as an input to the plurality of different image transformation operations, which leads to the concurrent execution of the different image transformation operations in the single pass. The one-time read of pixel values of the captured raw image sensor data is shown and described in detail, for example, in FIG. 4A and a comparison with conventional system of multiple times reading of same pixel values of the captured raw image sensor data is shown and described in detail, for example, in FIG. 4B. By virtue of the concurrent execution of the plurality of different image transformation operations in the single pass, latency from the time of capture to subsequent operations until plant detection occurs gets reduced.

In accordance with an embodiment, the plurality of different image transformation comprises: a demosaicing operation to convert the raw image sensor data to an RGB color image, a white balance operation, a color correction operation, a lens shading correction operation, and a contrast stretching operation. Generally, the demosaicing is a process of reconstructing a full-color image (i.e., the RGB color image) from an incomplete color information (raw image sensor data) captured by the image sensor 114. The reason being, each pixel value captures information about one color only (either red, green or blue), therefore, demosaicing is used to estimate missing color values for each pixel and create the full-color image. The demosaicing is also referred to as color interpolation or debayering process. For example, an image sensor of 640×640 may have 160×160 red pixels, 320×320 green pixels and 160×160 blue pixels. In such case, the color value for each missing pixel is estimated by interpolating the neighboring pixel values. The white balance operation is used to adjust the colors in the raw image sensor data to ensure that white objects appear truly white under different lighting conditions. The white balance operation may also be referred to as a white balance correction operation. The color temperature of light sources may vary, affecting the overall color appearance of an image. The white balance operation is used to compensate such variations (i.e., the variations caused due to illumination by daylight, incandescent bulbs or fluorescent bulbs) and ensure that colors in the image are accurate and consistent. The color correction operation is used for adjustment of colors in the raw image sensor data to achieve an accurate representation of original scenes. The color correction operation requires manipulation of color channels or values to correct color inaccuracies and enhance visual appeal. The color correction operation is useful to resolve various issues, such as color casts, poor white balance or inconsistencies in color reproduction. For example, in an implementation scenario, based on red, green and blue pixel values of an image sensor, the demosaiced images may have different color shades. In order to obtain the natural color of images, the color correction operation is applied on the demosaiced images. For example, an image of size 100×100×3 (RGB) is considered. The image is resized to a single array of 10000×3. Thereafter, a column is appended to the array computing the array of size 10000×4 (i.e., RGBA). The computed array is multiplied to a color correction matrix (CCM) to obtain a color corrected image of size 10000×3 as 10000×4*4×3=10000×3. The color corrected image is reshaped to an image to 100×100×3 (i.e., the RGB) image. After the execution of the color correction operation, greenish color tint is reduced and therefore, "grey color looks like grey" and error is reduced to 10 to 15 pixel intensities. In contrast, if the color correction operation is not executed then, in greenish tinted images, "grey color looks like greenish color" and error is present in 30 to 40 pixel intensities. The lens shading correction operation is used to correct non-uniform illumination often observed in images due to characteristics of camera lenses. Typically, the lens shading leads to darker corners or edges in an image and the lens shading correction is employed to smoothen the darker corners or edges. The lens shading correction is used to enhance the overall image quality by addressing optical imperfections and to ensure a more uniform appearance in terms of brightness across the entire image frame. The contrast stretching operation is used to improve the visual quality of an image by increasing the dynamic range of pixel intensity values. Alternatively stated, the range of pixel values to cover a wider range of intensity levels is stretched which makes the image more visually appealing and revealing more details. The processed image output, obtained by the concurrent execution of the plurality of different image transformation operations, manifests a clear color contrast ratio, more sharp edges and objects with more details. Thus, all these image post-processing operations, such as the demosaicing operation, the white balance operation, the color correction operation, the lens shading correction operation, and the contrast stretching operation, may be executed concurrently in a single pass (i.e., a single loop) based on the one-time read of pixel values of the captured raw image sensor data.

In accordance with an embodiment, the CPU 106 is further configured to load the raw image sensor data into Single Instruction, Multiple Data (SIMD) Registers 206 of the CPU 106 for the concurrent execution of the plurality of different image transformation operations in the single pass. Generally, the SIMD is a type of parallel processing architecture where, a single instruction is executed simultaneously on multiple data elements. The SIMD architecture uses the SIMD registers 206 to store multiple data elements and a single instruction is applied parallelly to all the elements stored in the SIMD registers 206. The use of the SIMD registers 206 allows a superfast execution of the plurality of different image transformation operations in the single pass on the raw image sensor data.

The CPU 106 is further configured to push the processed image output in the shared memory 110A accessible to the plurality of application nodes 112 in the camera apparatus 102. The shared memory 110A is accessible to the plurality of application nodes 112, such as the first NN model 208A, and the second NN model 208B. In an implementation, the first NN model 208A may be used for Foliage Detection (FD) and therefore, may also be referred to as a FD inference node. The second NN model 208B may be used for crop detection (CD) and therefore, may also be referred to as a CD inference node. Moreover, the access of the shared memory 110A to the plurality of application nodes 112 results in a significant reduction of latency in a second stage of copying the processed image output. The use of the shared memory 110A eliminates the requirement of copying the processed image output to each of the plurality of application nodes 112, consequently further reducing the latency as compared to conventional systems, where copying the same processed image output to each site, where applications are stored, is required. In other words, conventionally, the processed image output is copied to different applications and therefore, latency increases and processing time also increases, which is not preferrable. The shared memory 110A may be defined on a SOM chip.

The camera apparatus 102 further comprises the GPU 108, which is configured to execute the first NN model 208A on the processed image output accessed from the shared memory 110A to detect one or more foliage regions in the processed image output and concomitantly execute the second NN model 208B on the processed image output accessed from the shared memory 110A to detect one or more crop plants in the processed image output, where the plurality of application nodes 112 in the camera apparatus 102 comprises at least the first NN model 208A and the second NN model 208B. In an implementation, the first NN model 208A may be the foliage detection (FD) inference node and the second NN model 208B may be the crop detection (CD) inference node. The GPU 108 is configured to access the processed image output from the shared memory 110A and thereafter, execute the first NN model 208A on the processed image output in order to detect the one or more foliage regions present in the processed image output. Furthermore, the GPU 108 is further configured to access the processed image output from the shared memory

110A at the same time and thereafter, execute the second NN model 208B on the processed image output in order to detect the one or more crop plants present in the processed image output. The use of the first NN model 208A as the FD inference node and the second NN model 208B as the CD inference node is shown and described in more detail, for example, in FIG. 3B. Since the shared memory 110A is accessible to each of the plurality of application nodes 112, therefore, the first NN model 208A and the second NN model 208B can be simultaneously executed on the processed image output. Consequently, latency in a third stage of plant detection gets reduced which, further enables the camera apparatus 102 to be used for improved plant detection in real time or near real time.

In accordance with an embodiment, the GPU 108 is further configured to execute one or more first pre-processing operations on the processed image output prior to detection of the one or more crop plants by the second NN model 208B (CD NN model, also referred to as the CD inference node), and where the one or more first pre-processing operations are executed within the second NN model 208B in addition to the detection of the one or more crop plants. The one or more first pre-processing operations (e.g., resizing the processed image output, normalizing the resized image, flipping color channel, etc.) are executed within the second NN model 208B (e.g., the CD inference node) resulting in a notable reduction of latency in plant detection.

In a conventional camera system, typically, the one or more first pre-processing operations are performed typically by the CPU or may be GPU 108 in some cases, but not in AI models, hence, the conventional camera system has higher latency in plant detection. In contrast to the conventional camera system, the camera apparatus 102 manifests a further reduction in latency by virtue of execution of the one or more first pre-processing operations by shifting such one or more first pre-processing operations within the second NN model 208B itself.

In accordance with an embodiment, the second NN model 208B is configured such that a first set of layers of the second NN model 208B (CD NN model, also referred to as the CD inference node) is configured to execute the one or more first pre-processing operations, and a second set of layers of the second NN model 208B is configured to execute the detection of the one or more crop plants. In an implementation, the second NN model 208B may correspond to a Convolution Neural Network (CNN) model. In such a case, the CNN model may be configured as a two-branch architecture or three-branch architecture depending on an application scenario, where each branch may have a number of convolution layers to perform various operations. For example, the second NN model 208B has the first set of layers (e.g., a first set of convolution layers) and the second set of layers (e.g., a second set of convolution layers). The first set of layers is configured to execute the one or more first pre-processing operations on the processed image output accessed from the shared memory 110A. The second set of layers is configured to execute the detection of the one or more crop plants in the processed image output accessed from the shared memory 110A. By virtue of comprising the first set of layers and the second set of layers (i.e., the number of convolution layers), the second NN model 208B to further reduce latency and increase accuracy of the one or more first pre-processing operations as well as the detection of the one or more crop plants.

In accordance with an embodiment, the GPU 108 is further configured to resize the processed image output from a first size to a second size using a first layer of the first set of layers of the second NN model 208B (CD NN model, also referred to as the CD inference node) and normalize the resized image to a range of 0-255 pixel values using a second layer of the first set of layers of the second NN model 208B, where the resizing of the processed image output and the normalization of the resized image corresponds to the one or more first pre-processing operations. The first set of layers of the second NN model 208B may have N convolution layers, for example, a first layer, a second layer and up to a Nth layer for execution of the one or more first pre-processing operations. The one or more first pre-processing operations may include the resizing of the processed image output and normalization of the resized image. For example, the first layer is used for resizing of the processed image output that is from the first size to the second size and the resized image is generated. The second layer is used for normalizing the resized image by dividing the pixel values of the resized image by 255 to obtain the pixel values between 0 and 1 and thus, the normalized resized image is generated.

In accordance with an embodiment, the GPU 108 is further configured to flip a color channel of the normalized resized image using a third layer of the first set of layers of the second NN model 208B and feed the normalized resized image with the flipped color channel to the second set of layers of the second NN model 208B for the detection of the one or more crop plants, where the flip of the color channel corresponds to the one or more first pre-processing operations in addition to the resizing of the processed image output and the normalization of the resized image. The third layer of the first set of layers of the second NN model 208B is used for flipping the color channel of the normalized resized image. Generally, the color channel flipping refers to reordering or swapping of color channels of a color image. In digital images, colors are often represented using color channels, such as Red, Green and Blue (RGB) channels and a typical order of channels is Red, Green and Blue. By flipping or rearranging the order of these color channels, various visual effects can be created or color balance of the image can be altered. After flipping of the color channel, the normalized resized image is fed to the second set of layers (i.e., the second set of convolution layers) of the second NN model 208B for detection of the one or more crop plants. The flipping of the color channel corresponds to the one or more first pre-processing operations in addition to the resizing of the processed image output and the normalization of the resized image, which are performed by the first set of layers (i.e., the first set of convolution layers) of the second NN model 208B. The execution of the one or more first pre-processing operations by the first set of layers and the detection of the one or more crop plants by the second set of layers of the second NN model 208B is shown and described in more detail, for example, in FIG. 3B. By virtue of using the different layers, such as the first layer for resizing of the processed image output, the second layer for normalizing the resized image and the third layer for color channel flipping of the normalized resized image leads to an extremely fast processing of the processed image output which enables the camera apparatus 102 to support latency reduction in plant detection. Alternatively stated, the GPU 108 executes the second NN model 208B, which in turn executes the one or more first pre-processing operations, where each layer is configured to execute one pre-processing operation and pass the output to subsequent layer of the first set of layers, and finally the output from first set of layers passes to the second set of layers where actual model inference is executed. This is how the latency is reduced.

In accordance with an embodiment, the GPU 108 is further configured to execute one or more second pre-processing operations on the processed image output prior to detection of the one or more foliage regions by the first NN model 208A (e.g., Foliage detection (FD) model, also referred to as the FD inference node). In an implementation scenario of using the first NN model 208A as the FD inference node, the GPU 108 is configured to execute the one or more second pre-processing operations on the processed image output prior to the detection of the one or more foliage regions.

In accordance with an embodiment, the one or more second pre-processing operations comprises removing a portion of the processed image output, where the portion comprises pixels indicative of an artificial object in the FOV of the camera apparatus 102 and normalizing the processed image output after removal of the portion. The removal of the portion of the processed image output corresponds to removal of a specific range of pixels (e.g., 400 pixels from bottom) from the processed image output. The portion comprises pixels indicative of the artificial object (i.e., a man-made object) in the FOV of the camera apparatus 102. The artificial object, for example, may be a boom portion of the an agricultural vehicle or a machine part, in the FOV of the camera apparatus 102. After removal of the portion, the processed image output is smoothened by use of a median blur. The smoothened processed image output may be converted into a plurality of different color spaces. A set of channel operations may be executed either on an individual channel or combined channels in each color space of the plurality of different color spaces to enhance green pixels and suppress other pixels in the smoothened processed image output, where the green pixels are indicative of the one or more foliage regions. A normalized processed image output may be generated with the enhanced green pixels based on outputs received from each color space processing path associated with the plurality of different color spaces. A threshold value may be determined based on a histogram of the normalized processed image output. The determined threshold value may be applied to generate a first binary mask image of the normalized processed image output. Thereafter, one or more morphology operations may be applied to remove noise in the first binary mask image. The image regions that meet a defined criteria to be considered as foliage may be identified. An output binary mask image may be generated based on the applied one or more morphology operations and the identified image regions. An optimized binary image of foliage mask may be generated by applying filter on the output binary mask image to remove isolated regions and noise. The optimized binary image of foliage mask is generated for the corresponding processed image output.

In accordance with an embodiment, at least one or both of the one or more pre-processing operations is shifted to one or more layers of the first NN model 208A to be executed within the first NN model 208A (e.g., Foliage detection (FD) model, also referred to as the FD inference node) in addition to the detection of the one or more foliage regions. The one or more of the second pre-processing operations may be performed by the one or more layers (or one or more convolution layers, for example, a first set of convolution layers and a second set of convolution layers) of the first NN model 208A. The execution of the one or more second pre-processing operations and the detection of the one or more foliage regions are done within the first NN model 208A (e.g., Foliage detection (FD) model, also referred to as the FD inference node) that is by the one or more convolution layers, for example, a set of one or more convolution layers is configured to execute the one or more second pre-processing operations on the processed image output and another set of one or more convolution layers is configured to execute the detection of the one or more foliage regions in the processed image output. The execution of the one or more second pre-processing operations and the detection of the one or more foliage regions within the first NN model 208A is shown and described in more detail, for example, in FIG. 3B.

In accordance with an embodiment, the GPU 108 is further configured to monitor a list of operational states of the plurality of application nodes 112. The GPU 108 is configured to monitor whether one or more application nodes of the plurality of application nodes 112 are in a start mode, a working mode or a stop mode. The monitoring of various operation states of the plurality of application nodes 112 ensures that one or more applications are running and accordingly, one or more outputs (i.e., detected crop plants or detected one or more foliage regions) are obtained.

In accordance with an embodiment, the GPU 108 is further configured to control operation or an order of execution of the plurality of application nodes 112 based on the monitored list of operational states. The GPU 108 is further configured to control the order of execution of the plurality of application nodes 112 that means an application node 2 will start working after an application node 1 stopped working. The GPU 108 is configured to monitor a step-by-step execution of the plurality of application nodes 112 and thus, ensures the reliability in plant detection in addition to the latency reduction. Moreover, each operational state of the plurality of application nodes 112 can be displayed to a user by use of the display apparatus 120 through the user interface 122. The user may also monitor and control the operational states of the plurality of application nodes 112 by providing an input to the camera apparatus 102 through the user interface 122. Thus, there exists a two-way communication between the camera apparatus 102 and the user through the user interface 122, as shown in FIG. 1B.

In accordance with an embodiment, at least one of the CPU 106 or the GPU 108 is further configured to operate at least one of the plurality of agricultural implements 119 based on at least the detected one or more foliage regions and the detected one or more crop plants. In an implementation, the CPU 106 may be configured to actuate the first agricultural implement 119A based on the detected one or more foliage regions in the processed image output. Examples of implementation of the first agricultural implement 119A may include, but is not limited to, a sprayer comprising a plurality of electronically controllable spray nozzles and a cutter comprising a plurality of electronically controllable cutting blades (e.g., for lettuce thinning). In another implementation, the GPU 108 may be configured to actuate the second agricultural implement 119B based on the detected one or more crop plants in the processed image output. Examples of implementation of the second agricultural implement 119B may include, but is not limited to, a precision spot sprayer comprising a plurality of electronically controllable spray nozzles for spraying insecticide on the one or more crop plants in the agricultural field and a cutter comprising a plurality of electronically controllable cutting blades (e.g., for brooming of crop plants), and the like.

In an implementation, the detected one or more foliage regions and the detected one or more crop plants may be displayed on the display apparatus 120 connected to the camera apparatus 102 (as shown in FIG. 1B) and may be visible to a user through the user interface 122. Additionally, the operational states of each of the plurality of application nodes 112 can be displayed on the display apparatus 120 and can be made visible to the user through the user interface 122. Optionally, the user may provide an input either related to the operational states of the plurality of application nodes 112 or related to the order of execution of the plurality of application nodes 112 to the camera apparatus 102 using the user interface 122 comprised by the display apparatus 120. Thus, there is a bidirectional communication between the user and the camera apparatus 102.

Figure 2B:
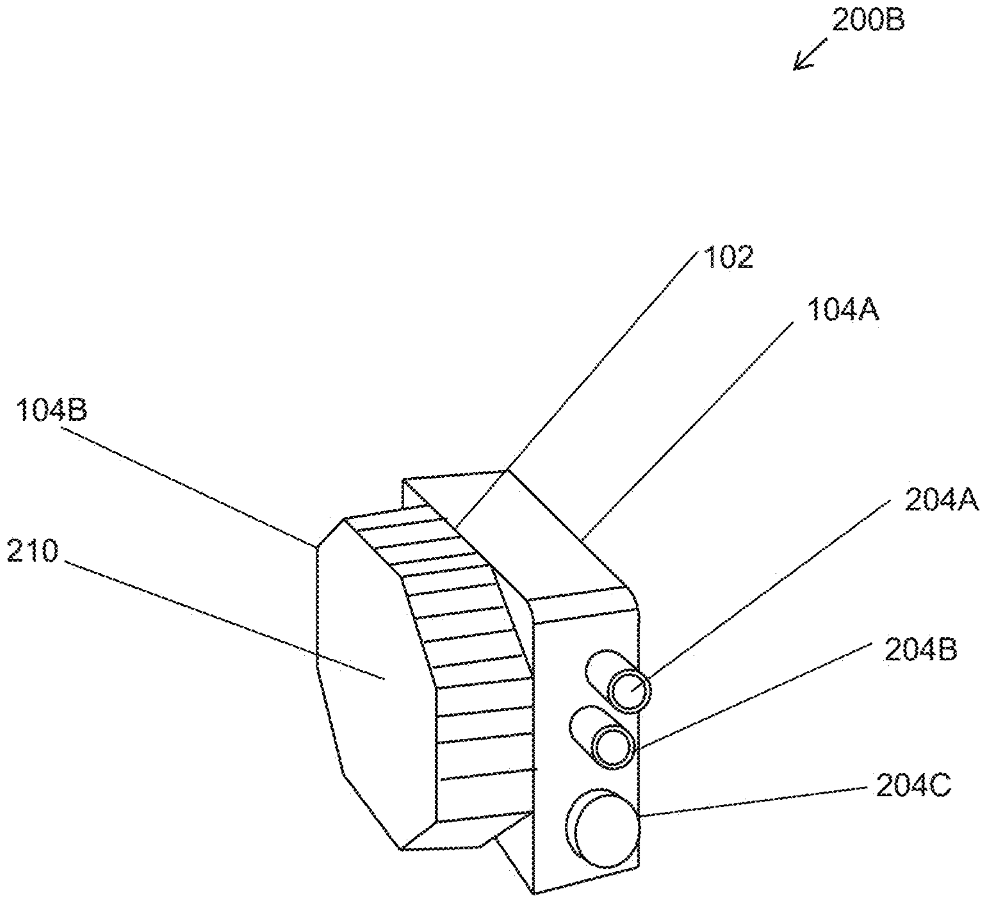
FIG. 2B is a diagram illustrating perspective rear view of a camera apparatus, in accordance with an embodiment of the present disclosure.

FIG. 2B is diagram illustrating a perspective rear view of a camera apparatus, in accordance with an embodiment of the present disclosure. FIG. 2B is described in conjunction with elements from FIGS. 1A, 1B, and 2A. With reference to FIG. 2B, there is shown a perspective rear view 200B of the camera apparatus 102.

The perspective rear view 200B of the camera apparatus 102 shows the rear side 104B of the camera apparatus 102, and each of the plurality of connectors, such as the first connector 204A, the second connector 204B and the third connector 204C. The plurality of connectors may be provided at the lateral side of the camera apparatus 102. The rear side 104B of the camera apparatus 102 comprises a passive heat sink 210. The passive heat sink 210 is used to dissipate the heat generated by one or more processors, such as the CPU 106 and the GPU 108 of the camera apparatus 102.

Figure 2C:
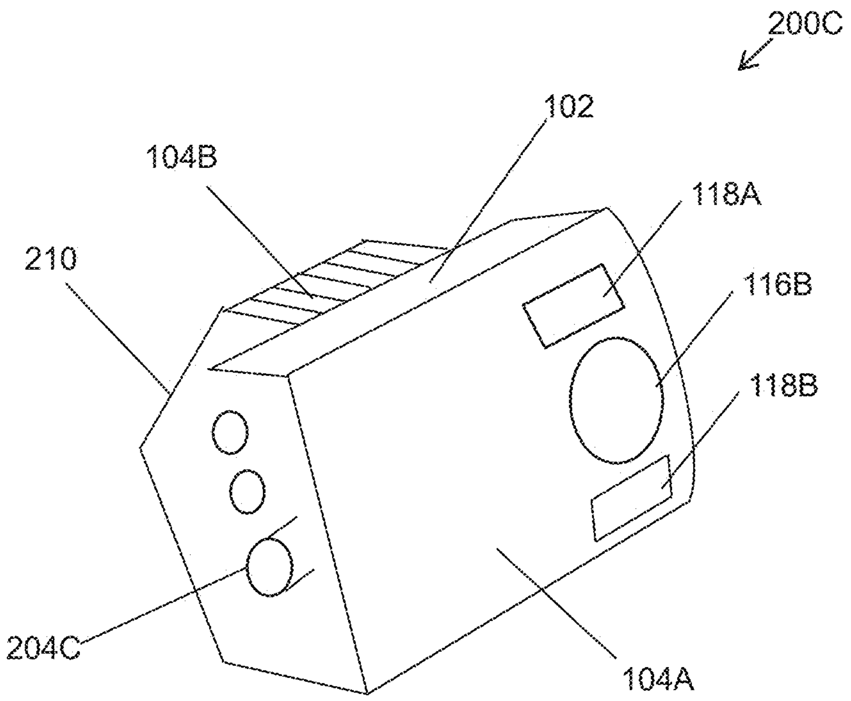
FIG. 2C is a diagram illustrating perspective front view of a camera apparatus, in accordance with an embodiment of the present disclosure.

FIG. 2C is diagram illustrating a perspective front view of a camera apparatus, in accordance with an embodiment of the present disclosure. FIG. 2C is described in conjunction with elements from FIGS. 1A, 1B, 2A, and 2B. With reference to FIG. 2C, there is shown a perspective front view 200C of the camera apparatus 102.

The perspective front view 200C of the camera apparatus 102 shows the front side 104A of the camera apparatus 102. The front side 104A of the camera apparatus 102 comprises the image sensor 114, the lens protector 116B, and the plurality of light diffusers, such as the first light diffuser 118A and the second light diffuser 118B. A plurality of light sources (not shown) is disposed around the image sensor 114 at two or more concentrated regions behind the first light diffuser 118A and the second light diffuser 118B.

Figure 2D:
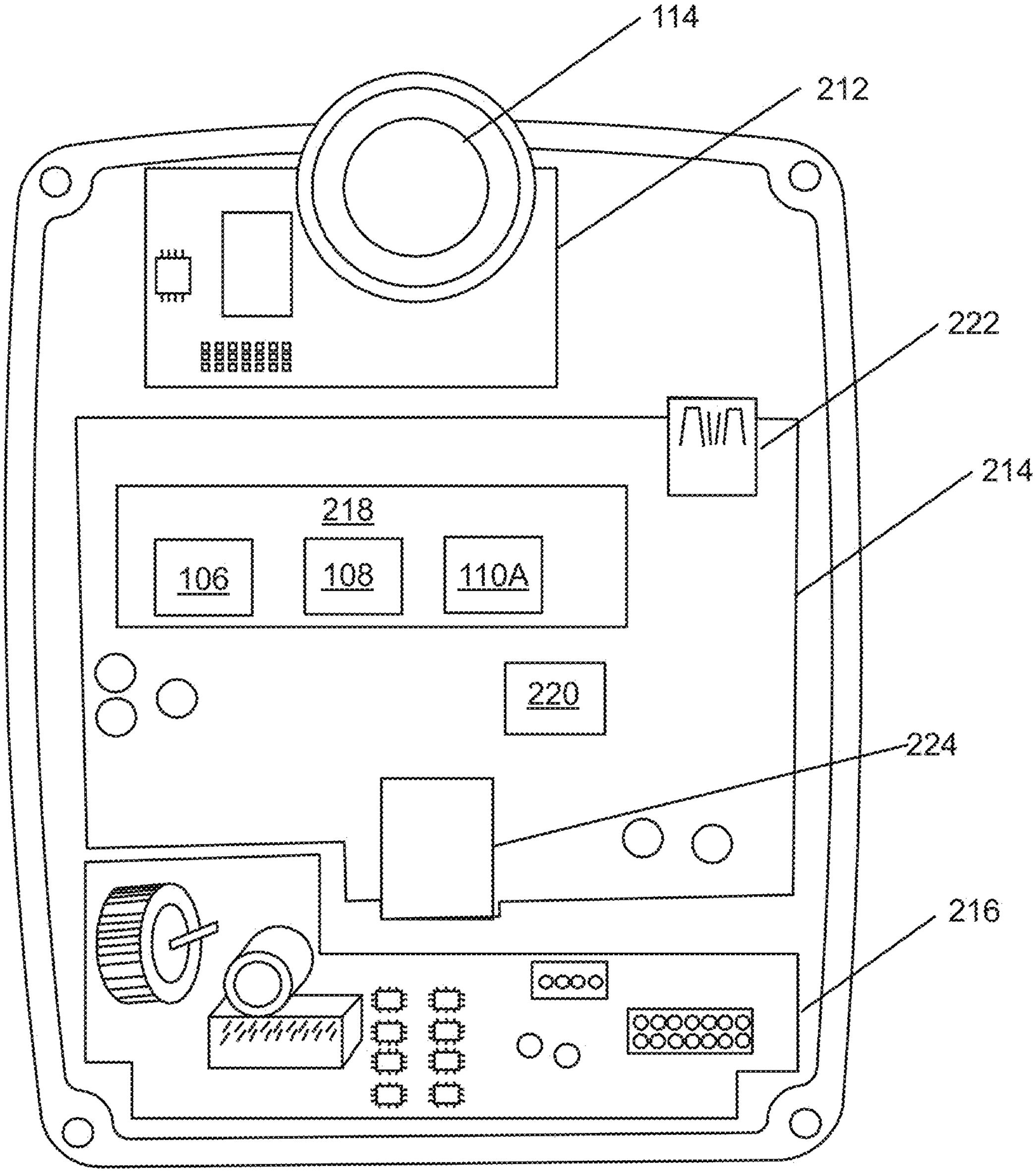
FIG. 2D is a diagram illustrating internal components of a camera apparatus, in accordance with an embodiment of the present disclosure.

FIG. 2D is a diagram illustrating various internal components of a camera apparatus, in accordance with an embodiment of the present disclosure. FIG. 2D is described in conjunction with elements from FIGS. 1A-1B, 2A, 2B, and 2C. With reference to FIG. 2D, there are shown a first printed circuit board (PCB) 212, a second PCB 214 and a third PCB 216. The first PCB 212 is configured as an image sensing and light control board, the second PCB 214 is configured as a custom designed motherboard and the third PCB 216 is configured as a power supply board. The first PCB 212 comprises the image sensor 114. The plurality of light sources 202B (not shown here) may be strobe LED PCBs (e.g., different PCBs) arranged on different regions (e.g., either side) of the first PCB 212 serving as strobe light with LED and capacitors, such as the plurality of capacitors 202A. In an example, the plurality of light sources 202B may be disposed around the image sensor 114 at two or more concentrated regions and powered by the plurality of capacitors 202A. The second PCB 214 comprises a system on module 218, a storage device 220 (e.g., a solid-state drive (SSD)), a universal serial bus (USB) port 222, an ethernet module 224. The system on module 218 comprises the CPU 106, the GPU 108 and the shared memory 110A and integrated to the second PCB 214. The system on module 218 makes the shared memory 110A accessible to the CPU 106 and the GPU 108. The third PCB 216 is configured to power the components of the first PCB 212 and the second PCB 214. The third PCB 216 comprises a number of actuators (e.g., actuator chips) and DC-to-DC converters.

In accordance with an embodiment, the CPU 106 is further configured to define the shared memory 110A accessible to the CPU 106 and the GPU 108 in the system on module (SOM) 218 integrated in the second PCB 214. The SOM 218 is integrated to the second PCB 214 of the camera apparatus 102 and the SOM 218 comprises each of the CPU 106, the GPU 108 and the shared memory 110A and therefore, makes the shared memory 110A accessible to each of the CPU 106 and the GPU 108.

Figure 3A:
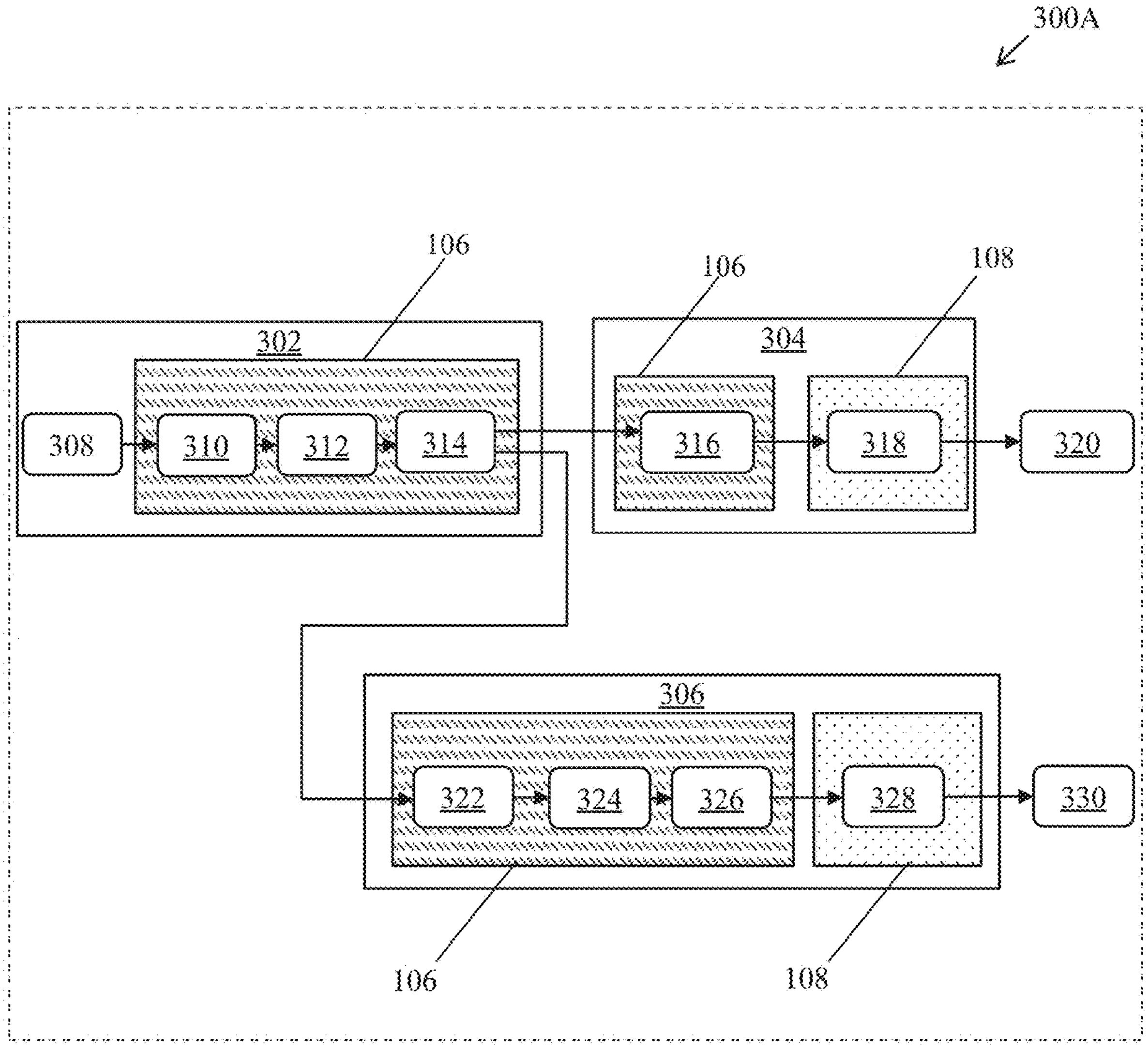
FIG. 3A (PRIOR ART)
FIG. 3A is a diagram illustrating a sequential execution of different image transformation operations and multiple transfer of a processed image output to different application nodes in a conventional system.

FIG. 3A is a diagram illustrating a sequential execution of different image transformation operations and multiple transfer of a processed image output to different application nodes in conventional systems. With reference to FIG. 3A, there is shown a scenario 300A that comprises a post-processing block 302 after capture of raw image sensor data, a first application node 304 and a second application node 306. In the post-processing block 302, the CPU 106 is configured to sequentially execute a plurality of different image transformation operations on raw image sensor data, shown in operations 310 to 314.

At operation 308, typically, in conventional systems, raw image sensor data of a FOV (e.g., less than 1.5 meters) of an agricultural field is captured using an image sensor.

At 310, then a CPU executes a first image transformation operation (e.g., Bayer to RGB conversion) on the captured raw image sensor data and generate a first output, which is used as an input to a second image transformation operation.

At operation 312, the CPU then further executes the second image transformation operation (e.g., white balance) on the first output, obtained from the execution of the first image transformation operation, and to generate a second output, which is used as an input to a third image transformation operation.

At operation 314, the CPU then further executes the third image transformation operation on the second output, obtained from the execution of the second image transformation operation, and to generate a processed image output. This way, the operations 310, 312 and 314 are executed sequentially, and output of one operation is used as input to another operation, which results in a first time increase in the latency of plant detection in conventional systems.

Thereafter, the processed image output from the post-processing block 302 is usually copied to multiple nodes, i.e., at the hosting site of multiple applications, such as the first application node 304 and the second application node 306. Thus, there is two times copying of the processed image output, which results in a second time increase in the latency of deducing inference from a neural network model when there are multiple models that need input of image that is captured and post processed by the post-processing block 302. In FIG. 3A, only two application nodes (i.e., the first application node 304 and the second application node 306) are shown (for sake of brevity). However, in another implementation, there may be N number of application nodes and may result in a hike of second time increase in the latency of plant detection, which is not preferrable for real time or near real time application scenario.

At the first application node 304, in conventional systems, the CPU needs to further execute one or more pre-processing operations 316 on the processed image output from the post-processing block 302 to make it suited as input to a conventional neural network model 318. A CPU or GPU then usually executes the conventional neural network model 318 on the processed image output to perform certain model inference provide an output 320.

At the second application node 306, another application or a conventional neural network model 328 may be hosted. Here too, the CPU may also require to execute one or more pre-processing operations 322, 324, 326 on the processed image output from the post-processing block 302 to make it suited as input to another conventional neural network model 328. The one or more pre-processing operations 322, 324, 326 may vary depending on use case, but for comparison, let say the one or more pre-processing operations may be resizing of the processed image output by the CPU at 322, normalization of the resized processed image again by the CPU at 324, and flipping of color channels of the resized processed image and transfer the resized processed image with flipped color channels to the GPU by the CPU at 326. The GPU then receives suitable input to execute the other neural network model 328 for model inference and generating its corresponding output 330.

Figure 3B:
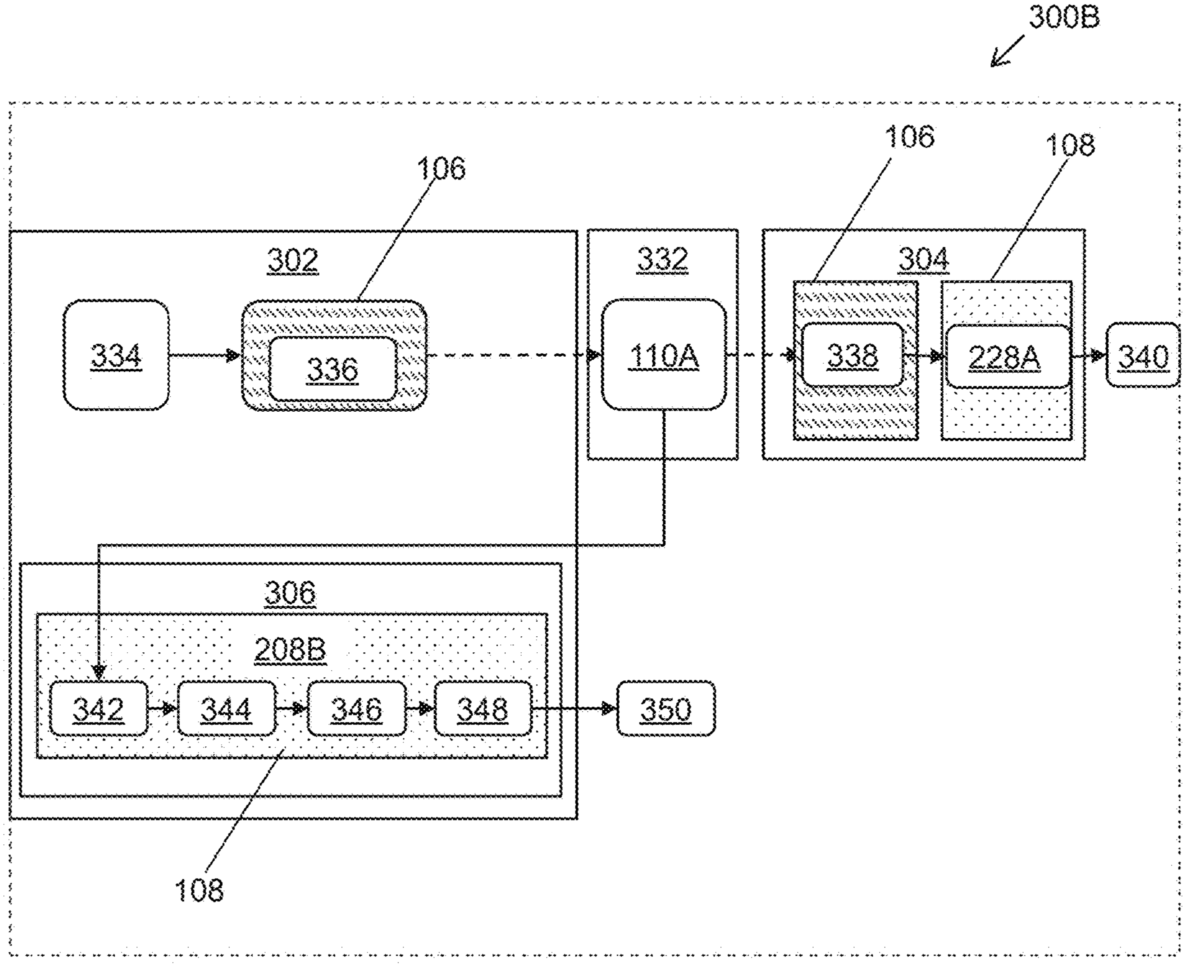
FIG. 3B is a diagram illustrating execution of different image transformation operations in a single pass and a concurrent sharing of a processed image output to different application nodes, in accordance with an embodiment of the present disclosure.

FIG. 3B is a diagram illustrating execution of different image transformation operations in a single pass and a concurrent sharing of a processed image output to different application nodes, in accordance with an embodiment of the present disclosure. FIG. 3B is described in conjunction with elements from FIGS. 1A-1B, 2A-2D, and 3A. With reference to FIG. 3B, there is shown a camera apparatus 300B that comprises a shared memory block 332 in addition to the components as shown in FIG. 3A. The shared memory block 332 comprises the shared memory 110A. The camera apparatus 300B corresponds to the camera apparatus 102 (for example, of FIG. 1A).

At operation 334, raw image sensor data of a FOV (e.g., 1.75 to 2.25 meters) of an agricultural field is captured using the image sensor 114.

At operation 336, the CPU 106 is configured to execute the plurality of different image transformation operations on the raw image sensor data in a single pass to obtain a processed image output. The plurality of different image transformation operations includes a demosaicing operation to convert the raw image sensor data to an RGB color image, a white balance operation, a color correction operation, a lens shading correction operation, and a contrast stretching operation, each operation has been described in detail, for example, in FIG. 2A. Moreover, the CPU 106 is configured to execute each of the plurality of different image transformation operations in the single pass by loading the raw image sensor data in the SIMD registers 206 of the CPU 106, where the pixel values are read one time to execute all post-processing operations in one loop (i.e., a single pass), thereby significantly reducing latency in a first stage.

In contrast to the conventional systems (e.g., shown in FIG. 3A) where different image transformation operations are executed sequentially and output of one image transformation operation is used as an input to another image transformation operation, the camera apparatus 300B of the present disclosure manifests a lower latency compared to conventional systems due to the concurrent execution of the plurality of different image transformation operations in the single pass and that too by reading pixels one time for multiple post processing operations.

Thereafter, beneficially, the CPU 106 is further configured to push the processed image output to the shared memory 110A comprised by the shared memory block 332. The shared memory 110A is user-defined. In this case, the shared memory 110A is accessible to each of multiple application nodes, such as the first application node 304 and the second application node 306. The use of the shared memory 110A eliminates the requirement of individually copying the processed image output to multiple application nodes as done in the conventional systems (for example, as shown in FIG. 3A). Each of the first application node 304 and the second application node 306 can simultaneously access the processed image output from the shared memory 110A and thus, the use of the shared memory 110A leads to a further latency reduction in a second stage in the camera apparatus 300B in contrast to the conventional systems.

At the first application node 304, in this case the first application node 304 is implemented as foliage detection (FD) inference node where a first neural network model (i.e., the first NN model 208A) is hosted. The GPU 108 directly executes the first NN model 208A using the image input, i.e., the processed image output from shared memory 110A to perform model inference, which is detection of one or more foliage regions present in the processed image output and provide the detected one or more foliage regions as an output 340 (i.e., FD output).

The second application node 306 is implemented as crop detection (CD) inference node, where a second neural network model (i.e., the NN model 208B) is hosted. In this case, the GPU 108 is configured to execute one or more first pre-processing operations on the processed image output prior to detection of one or more crop plants by the second NN model 208B, where the one or more first pre-processing operations (e.g., operations 342 to 348) are executed within the second NN model 208B itself in addition to the detection of the one or more crop plants. For example, a first set of layers of the second NN model 208B is configured to execute the one or more first pre-processing operations (i.e., the operations 342 to 348), and a second set of layers of the second NN model 208B are configured to execute the detection of the one or more crop plants and generate output 350.

At operation 342, the processed image output is resized from a first size to a second size using a first layer of the first set of layers of the second NN model 208B. At operation 346, the resized image is normalized to a range of 0-255 pixel values using a second layer of the first set of layers of the second NN model 208B. At operation 348, a color channel of the normalized resized image is flipped using a third layer of the first set of layers of the second NN model 208B. Thereafter, the normalized resized image with the flipped color channel is fed to the second set of layers of the second NN model 208B for the detection of the one or more crop plants and provide the detected one or more crop plants as an output 350 (i.e., CD output).

In conventional systems, such pre-processing operations (i.e., the operations 322 to 326 of FIG. 3A) that is resizing of the processed image output, normalization of the resized image and the color channel flipping of the normalized resized image are performed by the CPU. In contrast to conventional systems, in the camera apparatus 300B, the one or more first pre-processing operations (i.e., the operations 342 to 348 of FIG. 3B) are performed within the second NN model 208B by different layers, such as the first layer for resizing of the processed image output, the second layer for normalizing the resized image and the third layer for color channel flipping of the normalized resized image, of the first set of layers of the second NN model 208B. The use of different layers that is one layer for one specific function, second layer for another specific function, and the like, leads to a significant latency reduction in a third stage in the camera apparatus 300B. Thus, the camera apparatus 300B supports a three-stage latency reduction in comparison to the conventional systems (e.g., as shown in an example, in FIG. 3A). Since, the camera apparatus 300B manifests a significant reduction of latency in plant detection from time of capture of plants, an improved reliability and a fail-safe camera apparatus is obtained that do not miss plants detection as the camera apparatus 300B moves when mounted on a moving agricultural vehicle and used for the detection of the one or more foliage regions and the one or more crop plants in the agricultural field.

Figure 3C:
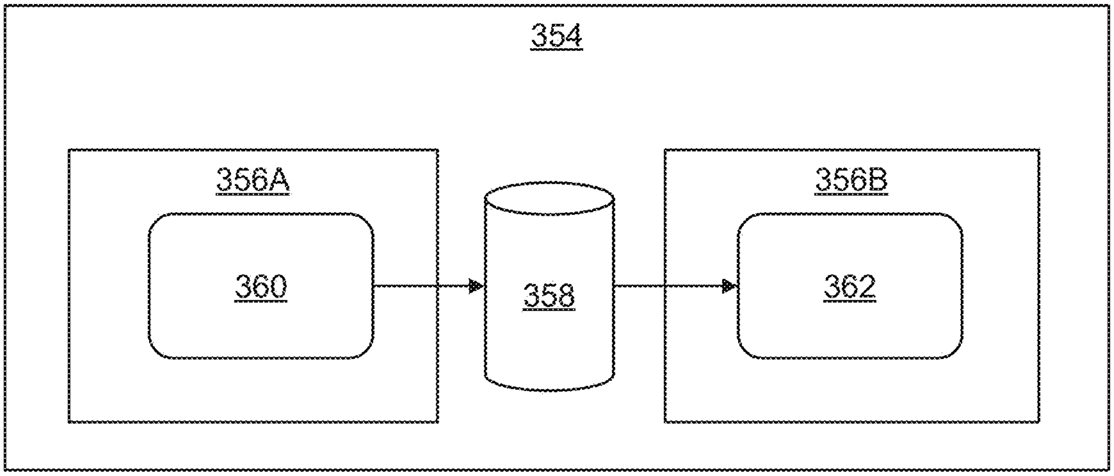
FIG. 3C is a diagram illustrating a producer-consumer architecture of an application node, in accordance with an embodiment of the present disclosure.

FIG. 3C is a diagram illustrating a producer-consumer architecture of an application node, in accordance with an embodiment of the present disclosure. FIG. 3C is described in conjunction with elements from FIGS. 1A-1B, 2A-2D, and 3A-3B. With reference to FIG. 3C, there is shown a producer-consumer architecture 354 comprised by an application node, for example, the second application node 306 (of FIG. 3B). The producer-consumer architecture 354 comprises two threads, for example, a first thread 356A (may also be represented as thread 1) and a second thread 356B (may also be represented as thread 2) and an image queue 358 between the first thread 356A and the second thread 356B.

The first thread 356A (i.e., the thread 1) is used on a producer side and the second thread 356B (i.e., the thread 2) is used on a consumer side. The producer side is used for capturing raw images at a very fast rate (e.g., 30 frames per second (FPS)) and the consumer side is used for the detection of one or more foliage regions and one or more crop plants from the captured raw images. The detection of the one or more foliage regions and one or more crop plants from the captured raw images at the consumer side may not be performed at the same rate at which the raw images are captured at the producer side which, may cause interference and hinder the detection process at the consumer side. Thus, in order to avoid the interference between the producer side and the consumer side, the image queue 358 is used between the first thread 356A (i.e., the thread 1) of the producer side and the second thread 356B (i.e., the thread 2) of the consumer side. Alternatively stated, the image queue 358 is used to delink the raw image capturing from the detection of the one or more foliage regions and one or more crop plants from the captured raw images. The first thread 356A (i.e., the thread 1) is used as for image callback at operation 360 and the second thread 356B (i.e., the thread 2) is used for the detection of one or more foliage regions by the first NN model 208A and the detection of one or more crop plants by the second NN model 208B at operation 362.

Figure 4A:
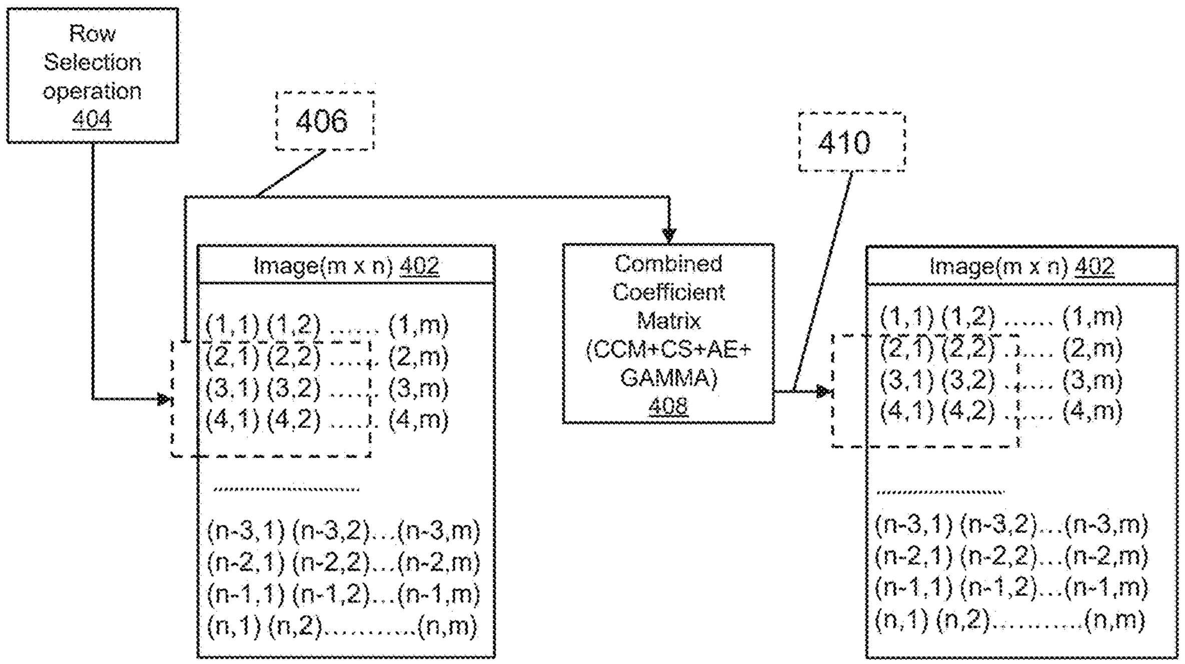
FIG. 4A is a diagram illustrating one-time read of pixel values of raw image sensor data, in accordance with an embodiment of the present disclosure.

FIG. 4A is a diagram illustrating one-time read of pixel values of raw image sensor data, in accordance with an embodiment of the present disclosure. FIG. 4A is described in conjunction with elements from FIGS. 1A-1B, 2A-2D, and 3A-3C. With reference to FIG. 4A, there is shown an image 402 having dimension of m×n. In order to read pixel values of the image 402, the CPU 106 is configured to execute a row selection operation 404. The execution of the row selection operation 404 allows to read the pixel values of the image 402 lying in one or more rows. At operation 406, the CPU 106 is configured to simultaneously pass the read pixel values of the image 402 to a plurality of different image transformation operations. At operation 408, the CPU 106 is configured to concurrently execute the plurality of different image transformation operations, such as the Bayer-to-RGB conversion of the image 402, the white balance, the color correction, the lens shading correction, the contrast stretching, and the like, in the single pass on the read pixel values of the image 402. At operation 410, a processed image output is generated after the execution of the plurality of different image transformation operations on the read pixel values of the image 402. As shown in FIG. 4A, the pixel values of the image 402 are read only one time for each of the plurality of image transformation operations and each of the plurality of image transformation operations are executed concurrently in the single pass, at the operation 408, leading to a significant reduction in latency in plant detection.

Figure 4B:
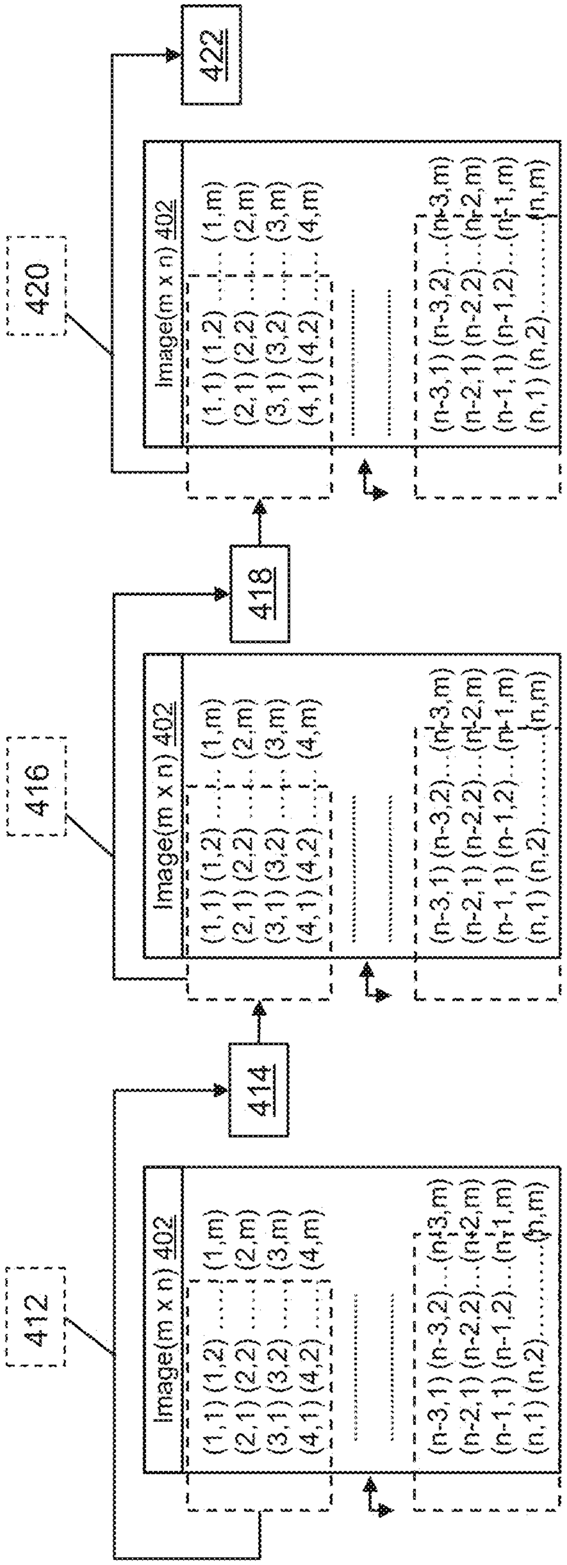
FIG. 4B (PRIOR ART)
FIG. 4B is a diagram illustrating multiple times reading of same pixel values of raw image sensor data in a conventional system.

FIG. 4B is a diagram illustrating multiple times reading of same pixel values of raw image sensor data. With reference to FIG. 4B, there is shown the multiple times reading of the same pixel values of the image 402 for execution of the plurality of different image transformation operations in prior art, i.e., in a conventional camera system. For example, at operation 412, the pixel values of the image 402 are read and passed to a first image transformation operation (e.g., the Bayer-to-RGB conversion of the image 402) at operation 414. At operation 416, the same pixel values of the image 402 are read again and passed to a second image transformation operation (e.g., the color correction operation) at operation 418. At operation 420, the same pixel values of the image 402 are read again and passed to a third image transformation operation (e.g., a GAMMA operation) at operation 422. Thus, it may be observed that for execution of the plurality of different image transformation operations, the same pixel values of the image 402 are read again and again resulting in a processing delay of the image 402 and increase the latency. In FIG. 4B, only three image transformations are shown (for sake of brevity). In another implementation, there may be more (e.g., four or five or up to N) number of image transformation operations which can be executed on the same pixel values of the image 402, where each operation contributes to latency.

Figure 5A:
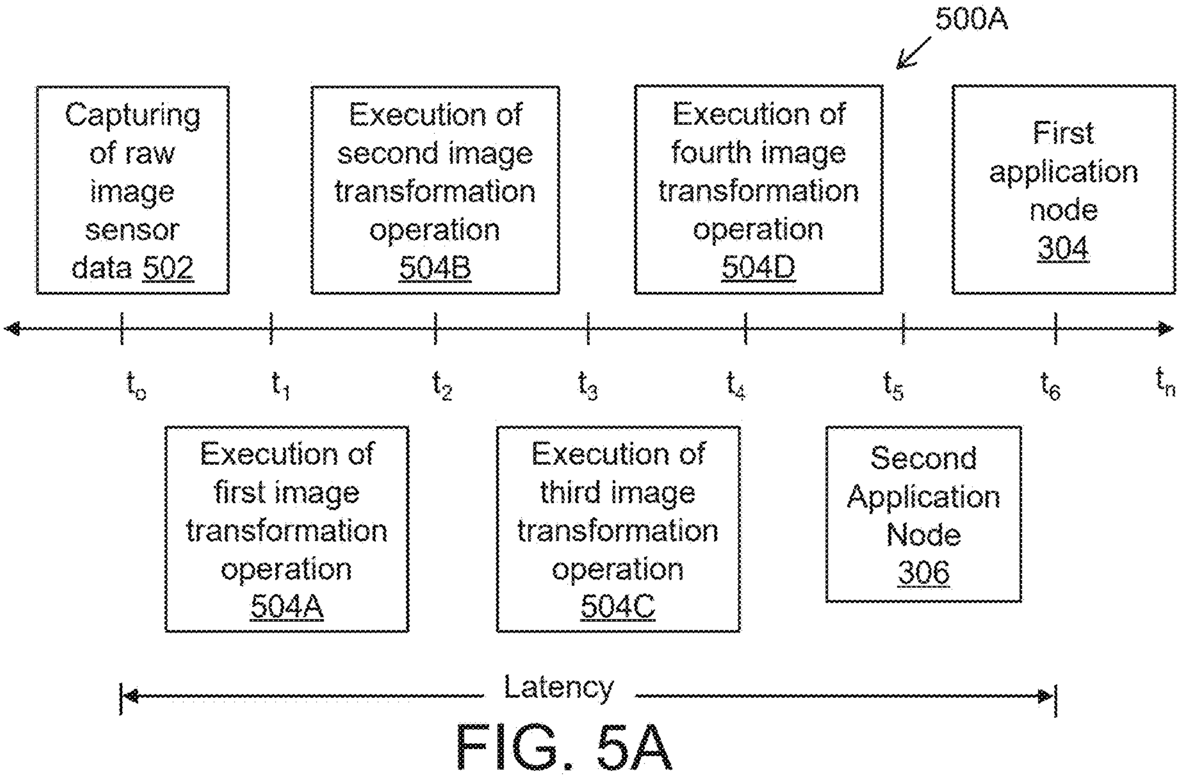
FIG. 5A (PRIOR ART)
FIG. 5A is a diagram illustrating latency computation from a time of image capture to model inference in a conventional system.

FIG. 5A is a diagram illustrating latency computation from a time of image capture to model inference in a prior art. With reference to FIG. 5A, there is shown a timing diagram 500A that illustrates a sequential execution of different image transformation operations at different time instants and how the sequential execution contributes to an increase in the latency in model inference (e.g., plant detection). There is shown different time instants from t0 to t6 at which a sequence of operations 502 to 508 is executed. For example, at time instant t0, the operation 502 of capturing raw image sensor data is executed. At time instant t1, the operation 504A of a first image transformation is executed on the captured raw image sensor data and a first output is generated. At time instant t2, the operation 504B of a second image transformation is executed on the first output generated at the time instant t1 and a second output is generated. At time instant t3, the operation 504C of a third image transformation is executed on the second output generated at the time instant t2 and a third output is generated. At time instant t4, the operation 504D of a fourth image transformation is executed on the third output generated at the time instant t3 and a processed image output is generated. The operations 504A to 504D are sequentially executed where output of one operation is used as an input to another operation and therefore, consumes lot of time for processing the raw image sensor data. At time instant t5, the operation 506 of copying the processed image output to the first application node 304 is executed, where the the first application node 304 performs a first model inference in the processed image output. At time instant t6, the operation 508 of copying the processed image output to the second application node 306 is executed, where the second application node 306 performs another model inference in the processed image output. The total time that is t0+t1+t2+t3+t4+t5+t6 contribute to the latency and it is approximately equal to greater than 50 milliseconds in conventional systems and more, which is not preferrable when performing the plant detection in real time or near real time.

Figure 5B:
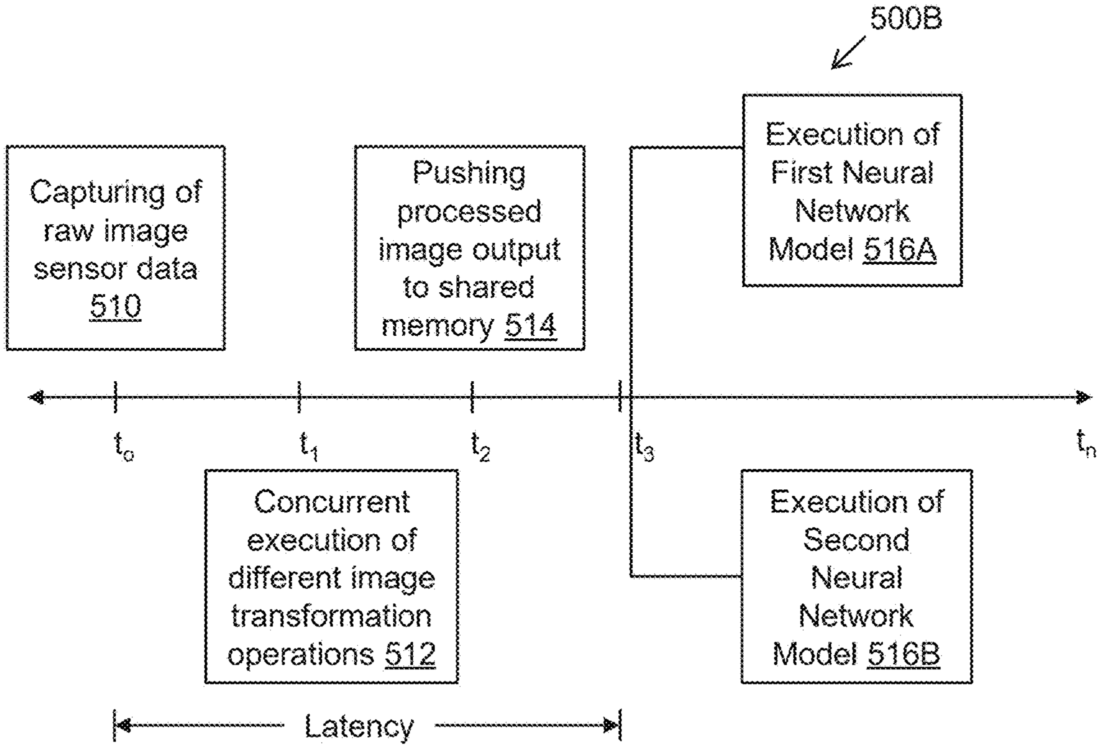
FIG. 5B is a diagram illustrating a reduction in latency of plant detection, in accordance with an embodiment of the present disclosure.

FIG. 5B is a diagram illustrating a reduction in latency of plant detection, in accordance with an embodiment of the present disclosure. FIG. 5B is described in conjunction with elements from FIGS. 1A-1B, 2A-2D, 3A-3C, 4A-4B and 5A. With reference to FIG. 5B, there is shown a timing diagram 500B that illustrates a reduction in latency of plant detection by concurrent execution of different image transformation operations in a single pass and by use of the shared memory 110A and how the concurrent execution of different image transformation operations contributes to the reduction in the latency of plant detection. There is shown different time instants from to to t3 at which a sequence of operations 510 to 516A-516B is executed. For example, at time instant t0, the operation 510 of capturing raw image sensor data is executed. At time instant t1, the operation 512 of a plurality of different image transformation is concurrently executed on the captured raw image sensor data in a single pass in contrast to the timing diagram 500A, where different image transformation operations are sequentially executed at different time instants, for example, the operation 504A at the time instant t1, the operation 504B at the time instant t2, the operation 504C at the time instant t3 and the operation 504D at the time instant t4. By virtue of the concurrent execution of the plurality of different image transformation operations in the single pass, the timing diagram 500B presents a reduction in latency. At time instant t2, the operation 514 of sharing the processed image output to the shared memory 110A is executed. The shared memory 110A is accessible to multiple application nodes, simultaneously. Therefore, at time instant t3, the operation 516A and the operation 516B are executed simultaneously, which further reduces the latency. At operation 516A, the first NN model 208A (i.e., the FD inference node) is executed to detect one or more foliage regions in the processed image output. The detection of the one or more foliage regions (i.e., how the one or more foliage regions are detected) has been described in detail, for example, in the co-pending U.S. application Ser. No. 18/401,066. At operation 516B, the second NN model 208B (i.e., the CD inference node) is executed to detect one or more crop plants in the processed image output. The detection of the one or more one or more crop plants (i.e., how the one or more crop plants are detected) has been described in detail, for example, in the co-pending U.S. application Ser. No. 18/582,148 filed on Feb. 20, 2024. The total time that is t0+t1+t2+t3 contribute to the latency and it is approximately equal to 2 to 15 milliseconds or 5-10 milliseconds significantly lesser than the latency in conventional systems while being less error prone (i.e., significantly improved accuracy and reliability at the same time) due to one-time read of pixels in performing the concurrent execution of different image transformation operations, and shifting further preprocessing operations in model itself.

FIGS. 6A, 6B, 6C, and 6D, collectively is a diagram illustrating a flowchart of a method of reducing latency in plant detection from a time of image capture, in accordance with an embodiment of the present disclosure. FIGS. 6A-6D are described in conjunction with elements from FIGS. 1A-1B, 2A-2D, 3A-3C, 4A-4B, and 5A-5B. With reference to FIGS. 6A-6D, there is shown a method 600 that includes operations 602 to 630. The CPU 106 and the GPU 108 of the camera apparatus 102 (of FIG. 1A) are configured to execute the method 600.

Figure 6A:
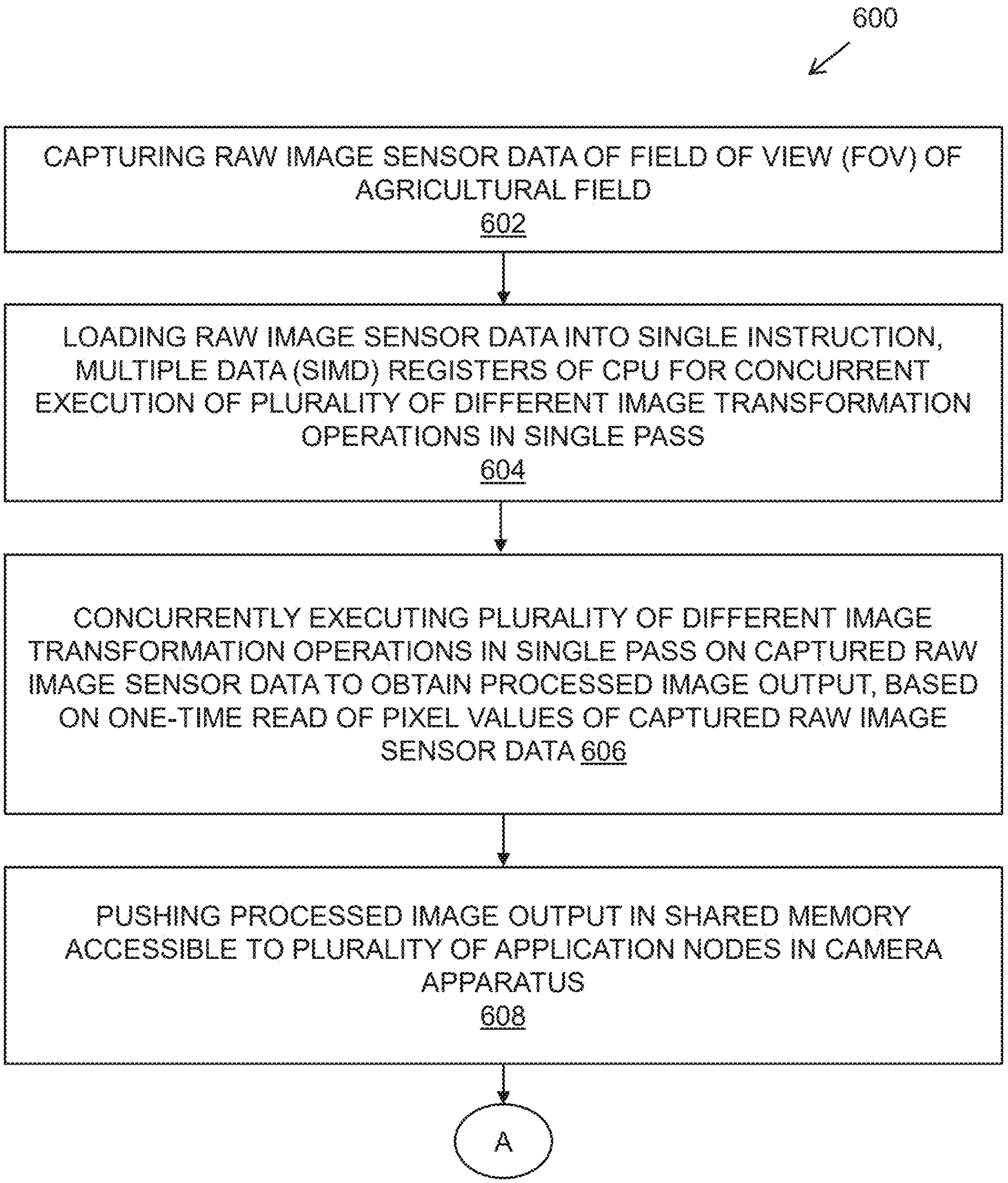
FIGS. 6A, 6B, 6C, and 6D, collectively is a diagram illustrating a flowchart of a method of reducing latency in plant detection from a time of image capture, in accordance with an embodiment of the present disclosure.

Referring to FIG. 6A, at 602, raw image sensor data of a field-of-view (FOV) of an agricultural field is captured. The raw image sensor is captured using the image sensor 114 of the camera apparatus 102. The FOV ranges from 1.75 to 2.25 meters of the agricultural field.

At 604, the captured raw image sensor data is loaded into the SIMD registers 206 of the CPU 106 for concurrent execution of a plurality of different image transformation operations in a single pass.

At 606, a plurality of different image transformation operations are executed in the single pass on the captured raw image sensor data to obtain a processed image output, based on an one-time read of pixel values of the captured raw image sensor data. The plurality of different image transformation operations includes a demosaicing operation to convert the raw image sensor data to an RGB color image, a white balance operation, a color correction operation, a lens shading correction operation, and a contrast stretching operation. Each image transformation operation is described in detail, for example, in FIG. 2A.

At 608, the processed image output is pushed to the shared memory 110A accessible to the plurality of application nodes 112 in the camera apparatus 102.

Figure 6B:
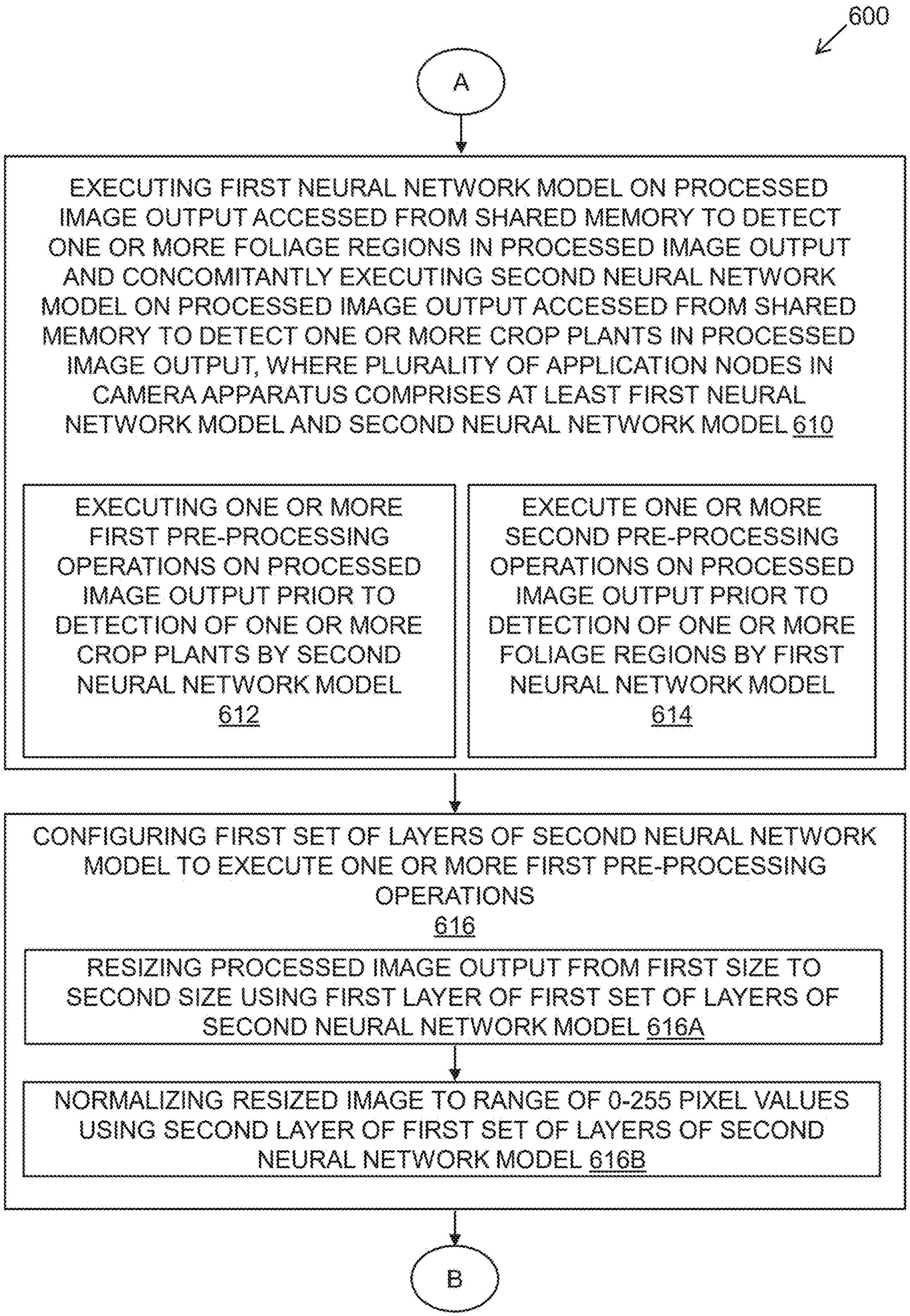
Figure 6C:
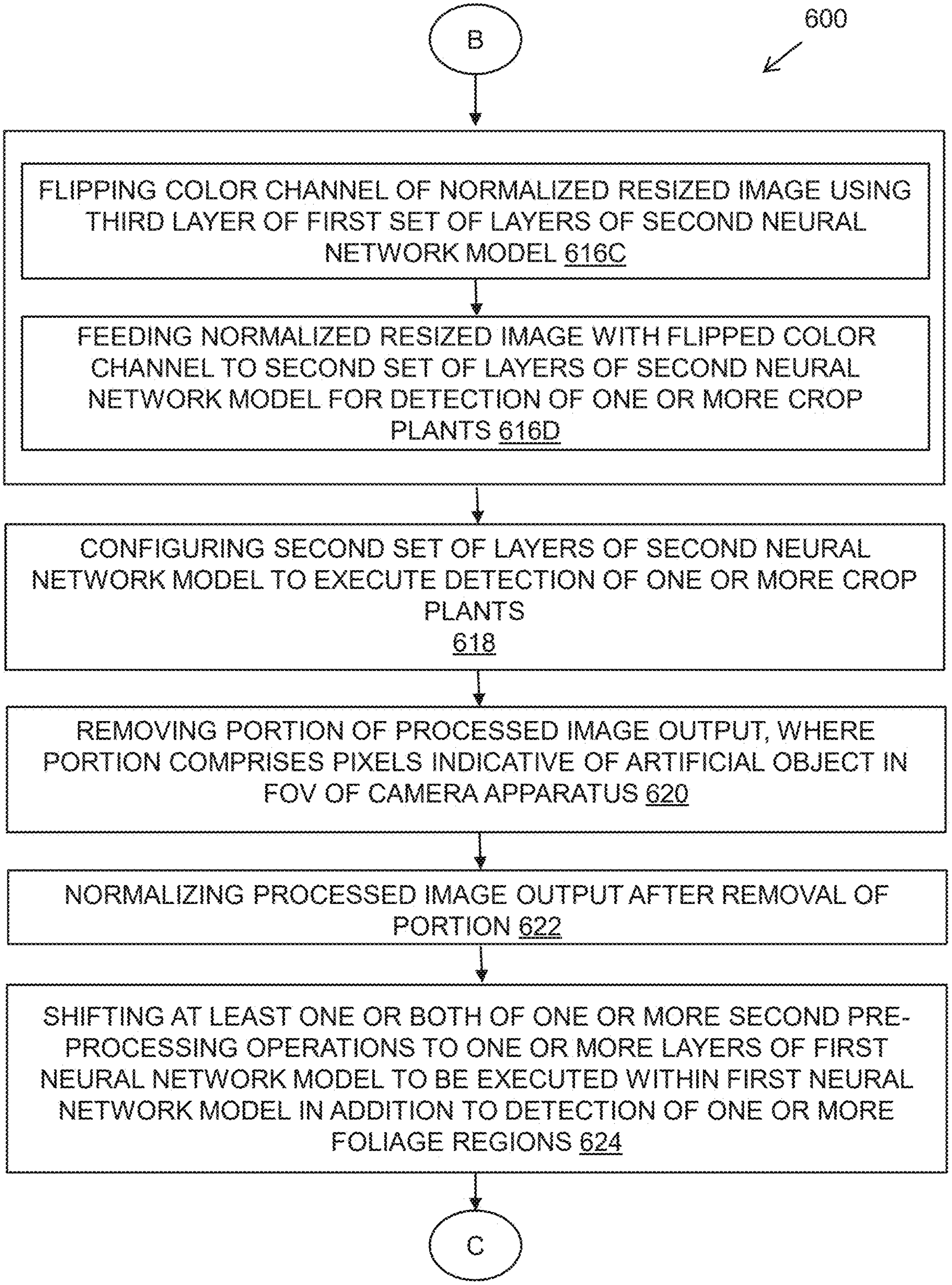

Now referring to FIG. 6B, at 610, the first NN model 208A is executed on the processed image output accessed from the shared memory 110A to detect one or more foliage regions in the processed image output and concomitantly the second NN model 208B is executed on the processed image output accessed from the shared memory 110A to detect one or more crop plants in the processed image output, where the plurality of application nodes 112 in the camera apparatus 102 comprises at least the first NN model 208A and the second NN model 208B. The operation 610 includes concurrent execution of operations 612 and 614.

At 612, one or more first pre-processing operations are executed on the processed image output prior to the detection of the one or more crop plants by the second NN model 208B, where the one or more first pre-processing operations are executed within the second NN model 208B in addition to the detection of the one or more crop plants. The operation 612 includes the execution of the operations 616 and 618.

At 614, one or more second pre-processing operations are executed on the processed image output prior to detection of the one or more foliage regions by the first NN model 208A. The operation 614 includes the execution of the operations 620, 622 and 624.

At 616, a first set of layers of the second NN model 208B is configured to execute the one or more first pre-processing operations. The operation 616 includes a plurality of sub-operations, such as operations 616A, 616B, 616C and 616D. At 616A, a first layer of the first set of layers of the second NN model 208B is configured to resize the processed image output from a first size to a second size. At 616B, a second layer of the first set of layers of the second NN model 208B is configured to normalize the resized image to a range of 0-255 pixel values. Now referring to FIG. 6C, at 616C, a third layer of the first set of layers of the second NN model 208B is configured to flip a color channel of the normalized resized image. The resizing of the processed image output, the normalizing of the resized image, and color channel flipping of the normalized resized image corresponds to the one or more first pre-processing operations. At 616D, the normalized resized image with the flipped color channel is fed to the second set of layers of the second NN model 208B for detection of the one or more crop plants.

At 618, a second set of layers of the second NN model 208B is configured to execute the detection of the one or more crop plants.

At 620, a portion of the processed image output is removed in the one or more second pre-processing operations. The portion comprises pixels indicative of an artificial object in the FOV of the camera apparatus 102.

At 622, after removal of the portion, the processed image output is normalized in the one or more second pre-processing operations.

At 624, at least one or both of the one or more second pre-processing operations is shifted to one or more layers of the first NN model 208A to be executed within the first NN model 208A in addition to the detection of the one or more foliage regions.

Figure 6D:
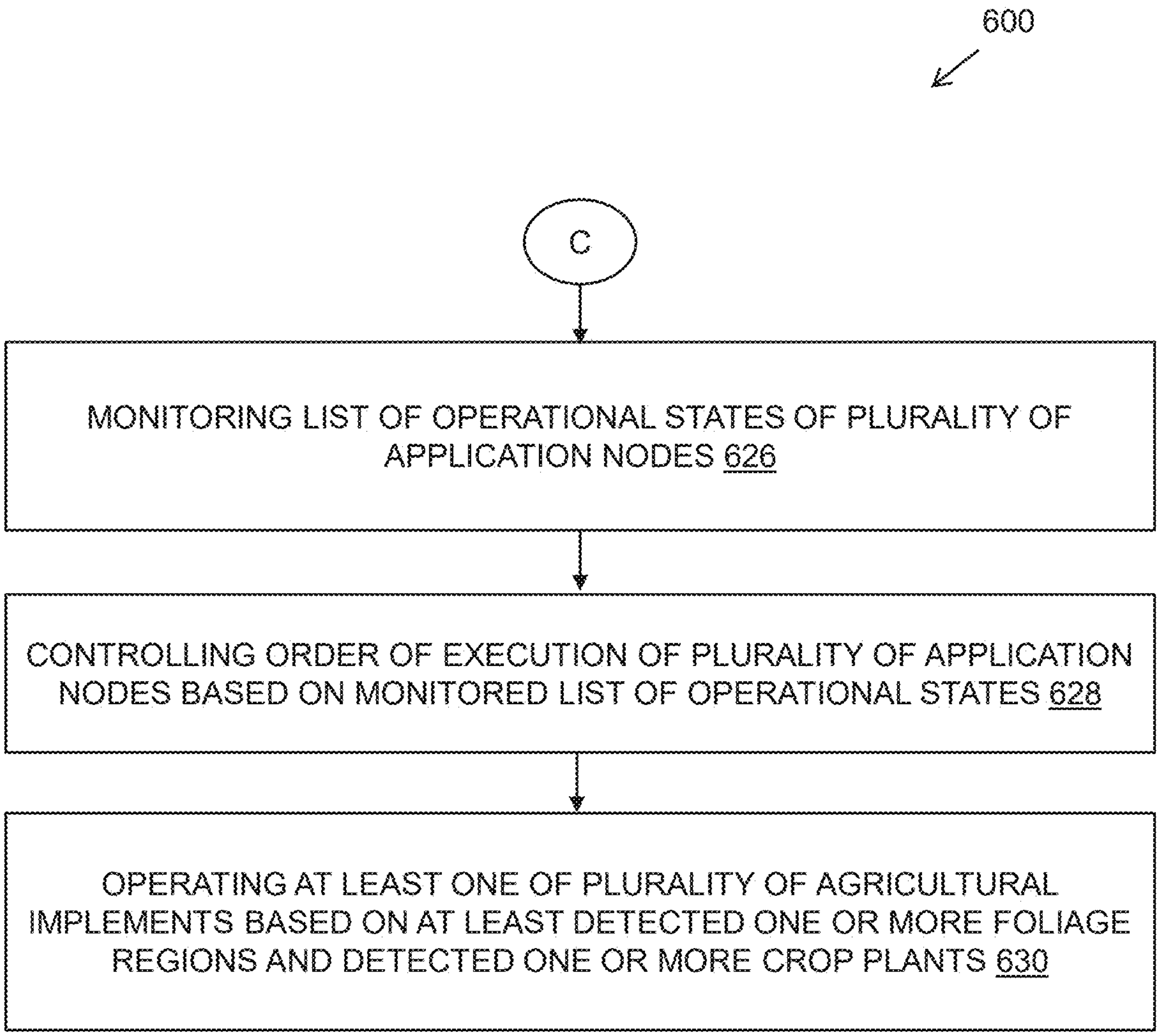

Now referring to FIG. 6D, at 626, a list of operational states of the plurality of application nodes 112 is monitored in order to ensure the working of each of the plurality of application nodes 112.

At 628, an order of execution of the plurality of application nodes 112 is controlled based on the monitored list of operational states of the plurality of application nodes 112.

At 630, at least one of the plurality of agricultural implements 119 is operated based on at least the detected one or more foliage regions and the detected one or more crop plants.

The operations 602 to 630 are only illustrative and other alternatives can also be provided where one or more operations are added, one or more steps are removed, or one or more operations are provided in a different sequence without departing from the scope of the claims herein.

In one aspect, the present disclosure provides a computer program product comprising program instructions for performing the method 600, when executed by one or more processors (e.g., the CPU 106 and the GPU 108 of the camera apparatus 102). In a yet another aspect, the present disclosure provides a non-transitory computer-readable storage medium comprising instructions which, when executed by a computer, cause the computer to carry out the method 600 for reducing latency in plant detection from a time of image capture.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to the CPU 106, or the GPU 108, or the system on module (SOM) 218, a microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory or any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system (i.e., the camera apparatus) described herein may be included in a semiconductor intellectual property core, such as a microcontroller (e.g., embodied in HDL) and transformed to hardware in the production of integrated circuits. Additionally, the system (i.e., the camera apparatus) described herein may be embodied as a combination of hardware and software. Thus, the present disclosure should not be limited by any of the above-described exemplary embodiments but should be defined only in accordance with the following claims and their equivalents.

What is claimed is:

1. A camera apparatus, comprising:

a central processing unit (CPU) configured to:

capture raw image sensor data of a field-of-view (FOV) of an agricultural field using an image sensor;

concurrently execute a plurality of different image transformation operations in a single pass on the captured raw image sensor data to obtain a processed image output, based on a one-time read of pixel values of the captured raw image sensor data; and push the processed image output in a shared memory accessible to a plurality of application nodes in the camera apparatus, wherein the shared memory is user-defined; and a graphical processing unit (GPU) configured to:

cause the plurality of application nodes to concurrently access the processed image output from the shared memory to detect one or more foliage regions or one or more crop plants in the processed image output.

2. The camera apparatus according to claim 1, wherein at least one of the CPU or the GPU is further configured to operate at least one of a plurality of agricultural implements based on the detected one or more foliage regions.

3. The camera apparatus according to claim 1, wherein at least one of the CPU or the GPU is further configured to operate at least one of a plurality of agricultural implements based on the detected one or more crop plants.

4. The camera apparatus according to claim 1, wherein at least one of the CPU or the GPU is further configured to operate at least one of a plurality of agricultural implements based on the detected one or more foliage regions and the detected one or more crop plants.

5. The camera apparatus according to claim 1, wherein the GPU is further configured to monitor a list of operational states of the plurality of application nodes, and wherein the list of operational states comprises a start mode, a working mode and a stop mode of each of the plurality of application nodes.

6. The camera apparatus according to claim 5, wherein the GPU is further configured to control operation or an order of execution of the plurality of application nodes based on the monitored list of operational states.

7. The camera apparatus according to claim 1, wherein the plurality of application nodes in the camera apparatus comprises at least a first neural network model and a second neural network model.

8. The camera apparatus according to claim 7, wherein the GPU is further configured to execute the first neural network model on the processed image output to detect the one or more foliage regions in the processed image output and concomitantly execute the second neural network model on the processed image output to detect the one or more crop plants in the processed image output.

9. The camera apparatus according to claim 1, wherein the CPU is further configured to concurrently provide the read pixel values of the captured raw image sensor data as an input to each of the plurality of different image transformation operations.

10. The camera apparatus according to claim 1, wherein the plurality of different image transformation comprises: a demosaicing operation to convert the raw image sensor data to a Red, Green, Blue (RGB) color image, a white balance operation, a color correction operation, a lens shading correction operation, and a contrast stretching operation.

11. The camera apparatus according to claim 1, wherein the CPU is further configured to load the raw image sensor data into Single Instruction, Multiple Data (SIMD) Registers of the CPU for the concurrent execution of the plurality of different image transformation operations in the single pass.

12. The camera apparatus according to claim 1, wherein the GPU is further configured to execute one or more first pre-processing operations on the processed image output prior to detection of the one or more crop plants by a second neural network model, and wherein the one or more first pre-processing operations are executed within the second neural network model in addition to the detection of the one or more crop plants.

13. The camera apparatus according to claim 12, wherein the second neural network model is configured such that:

a first set of layers of the second neural network model is configured to execute the one or more first pre-processing operations; and a second set of layers of the second neural network model is configured to execute the detection of the one or more crop plants.

14. The camera apparatus according to claim 13, wherein the GPU is further configured to:

resize the processed image output from a first size to a second size using a first layer of the first set of layers of the second neural network model; and normalize the resized image to a range of 0-255 pixel values using a second layer of the first set of layers of the second neural network model, wherein the resizing of the processed image output and the normalization of the resized image corresponds to the one or more first pre-processing operations.

15. The camera apparatus according to claim 14, wherein the GPU is further configured to:

flip a color channel of the normalized resized image using a third layer of the first set of layers of the second neural network model; and feed the normalized resized image with the flipped color channel to the second set of layers of the second neural network model for the detection of the one or more crop plants, wherein the flip of the color channel corresponds to the one or more first pre-processing operations in addition to the resizing of the processed image output and the normalization of the resized image.

16. The camera apparatus according to claim 1, wherein the GPU is further configured to execute one or more second pre-processing operations on the processed image output prior to detection of the one or more foliage regions by a first neural network model.

17. The camera apparatus according to claim 16, wherein the one or more second pre-processing operations comprises:

removing a portion of the processed image output, wherein the portion comprises pixels indicative of an artificial object in the field-of-view (FOV) of the camera apparatus; and normalizing the processed image output after removal of the portion.

18. The camera apparatus according to claim 17, wherein the artificial object is one of: a boom portion of an agricultural vehicle or a machine part, lying in the field-of-view (FOV) of the camera apparatus 102.

19. The camera apparatus according to claim 1, wherein at least one of the CPU or the GPU is further configured to delink the capture of the raw image sensor data from the detection of the one or more foliage regions and the one or more crop plants.

20. A method for reducing latency in plant detection from a time of image capture, the method comprising:

in the camera apparatus:

capturing raw image sensor data of a field-of-view (FOV) of an agricultural field using an image sensor of the camera apparatus;

concurrently executing a plurality of different image transformation operations in a single pass on the captured raw image sensor data to obtain a processed image output, based on one-time read of pixel values of the captured raw image sensor data;

pushing the processed image output in a shared memory accessible to a plurality of application nodes in the camera apparatus, wherein the shared memory is user-defined; and causing the plurality of application nodes in the camera apparatus to concurrently access the processed image output from the shared memory to detect one or more foliage regions or one or more crop plants in the processed image output.

* * * * *